(12) United States Patent
Miller et al.

(10) Patent No.: US 8,237,633 B2
(45) Date of Patent: Aug. 7, 2012

(54) ELECTRO-LUMINESCENT DISPLAY WITH ADJUSTABLE WHITE POINT

(75) Inventors: Michael E. Miller, Honeoye Falls, NY (US); Michael L. Boroson, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 757 days.

(21) Appl. No.: 12/464,123

(22) Filed: May 12, 2009

(65) Prior Publication Data

US 2010/0289727 A1 Nov. 18, 2010

(51) Int. Cl.
G09G 5/02 (2006.01)
(52) U.S. Cl. ............ 345/76; 345/600; 345/589; 313/483
(58) Field of Classification Search .............. 345/76, 345/589, 600; 313/483
See application file for complete search history.

(56) References Cited

U.S. PATENT DOCUMENTS

| | | | |
|---|---|---|---|
| 4,449,148 A | 5/1984 | Inohara et al. | |
| 4,769,292 A | 9/1988 | Tang et al. | |
| 5,061,569 A | 10/1991 | VanSlyke et al. | |
| 6,535,190 B2 | 3/2003 | Evanicky | |
| 6,840,646 B2 | 1/2005 | Cornelissen et al. | |
| 6,897,876 B2 * | 5/2005 | Murdoch et al. | 345/589 |
| 7,230,594 B2 | 6/2007 | Miller et al. | |
| 7,301,543 B2 * | 11/2007 | Higgins | 345/589 |
| 2004/0264193 A1 * | 12/2004 | Okumura | 362/276 |
| 2006/0044226 A1 * | 3/2006 | Liedenbaum et al. | 345/76 |
| 2008/0018798 A1 * | 1/2008 | Park et al. | 348/655 |
| 2008/0297028 A1 * | 12/2008 | Kane et al. | 313/498 |
| 2010/0103201 A1 | 4/2010 | Nakanishi et al. | |

FOREIGN PATENT DOCUMENTS

| | | |
|---|---|---|
| JP | 2007-141737 A | 6/2007 |
| WO | 2009/001579 A1 | 12/2008 |

OTHER PUBLICATIONS

PCT International Search Report dated Jul. 29, 2010.

* cited by examiner

*Primary Examiner* — Alexander Eisen
*Assistant Examiner* — Viet Pham
(74) *Attorney, Agent, or Firm* — Morgan, Lewis & Bockius LLP

(57) ABSTRACT

The present invention provides an EL display adapted to receive a three-color input image signal, including three gamut-defining EL emitters for emitting red, green, and blue colored light and two additional EL emitters for emitting at least two additional colors of light, the chromaticity coordinates of the at least two additional colors of light lying inside the gamut and near the Plankian Locus; a structure for providing a display white point; and a controller responsive, to the provided display white point and the input image signal for providing first separate drive signals for the three gamut-defining EL emitters and second separate drive signals for the two additional EL emitters, wherein the respective luminance values corresponding to the second separate drive signals are each a function of the input image signal and the distances between the display white point and the pseudo-blackbody points of the two additional colors.

19 Claims, 15 Drawing Sheets

ELECTRO-LUMINESCENT DISPLAY WITH ADJUSTABLE WHITE POINT

CROSS REFERENCE TO RELATED APPLICATIONS

Reference is made to commonly-assigned U.S. patent application Ser. No. 12/174,085 filed Jul. 16, 2008 entitled "CONVERTING THREE-COMPONENT TO FOUR-COMPONENT IMAGE" to Ronald S. Cok et al., the disclosure of which is incorporated herein.

FIELD OF THE INVENTION

The present invention provides an electro-luminescent display apparatus having an adjustable white point. Specifically, an electro-luminescent display apparatus is provided having at least two in-gamut electro-luminescent emitters for emitting two colors of light to provide an adjustable white point, with reduced power consumption.

BACKGROUND OF THE INVENTION

Flat-panel display devices are widely used in conjunction with computing devices, in portable devices, and for entertainment devices; including televisions. Such displays typically employ a plurality of pixels distributed over a substrate to display images. Each pixel incorporates several, differently-colored emitters, typically red, green, and blue, to represent each image element represented within an input image signal. A variety of flat-panel display technologies are known, for example, plasma displays, field emissive displays (FEDs), liquid crystal displays (LCDs), and electro-luminescent (EL) displays, such as organic light-emitting diode (OLED) displays. To present images on these displays, the display typically receives an image input signal containing three-color-components for each image element which the display utilizes to drive each differently-colored emitter for each pixel.

In emissive displays, including plasma, field-emissive and electro-luminescent displays, the amount of visible radiant energy produced by the display is proportional to the amount of power that the display consumes. This same relationship does not exist in transmissive displays, such as certain LCDs, in which the energy provided to the light source is not modulated as these displays typically create enough light to provide the brightest possible image and then modulate the light rather than the input energy so that only the necessary portion of the light is transmitted to the user.

Displays are used in many professional and consumer electronic devices. In many professional and consumer electronic devices, the user is given the opportunity to adjust the color temperature of the display device. Typically, the color temperature of the display is adjusted to various white points representing different points on or near the Planckian Locus, including colors having color coordinates near the color of standard emitters such as D50, D65, D70 and D95. Further, some display devices provide the ability to change the color temperature of the display at a higher level. For example, the color temperature of the display can be adjusted to D65 when the display is placed in modes, such as those referred to by names such as "Cinema" and the display and to a color temperature such as D93 when placed in modes, such as those referred to by names such as "Standard".

It is known to adjust the color temperature of a display device. For example, in the LCD art, it is known to use multiple illumination sources to enable the adjustment of color temperature in a display. For example, Cornelissen in U.S. Pat. No. 6,840,646, entitled "Illumination system and display device" discusses a liquid crystal display device with an adjustable backlight, comprising a low-pressure discharge lamp and additional blue LEDs. By changing the ratio of the power to these two light sources, the color of the LCD backlight can be modified to change the color temperature of the display as it passes through the liquid crystal and red, green, and blue color filters. Similarly, Evanicky in U.S. Pat. No. 6,535,190, entitled "Multiple light source color balancing system within a liquid crystal flat panel display" discusses an LCD having fluorescent lamps that serve as the backlight for the LCD, some lamps producing a different color of light than others. By adjusting the ratio of light produced by each of the lamps, the color temperature of the backlight and therefore the color temperature of the light that is passed through the LCD and its red, green, and blue color filters is modified. Although, this method adds cost to the overall LCD system, these displays make relatively efficient use of the light that is produced, as the light source is directly modified to create the color of light that is needed. Unfortunately, it is not possible to employ adjustable backlights in emissive displays and so this method cannot be applied directly in emissive displays, such as EL displays.

It is also known to adjust the color temperature of a display by adjusting the ratios of the red, green, and blue light-emitting elements to change the color temperature of the display. For example, Inohara et al. in U.S. Pat. No. 4,449,148, entitled "Image Display Apparatus" discusses a method for adjusting the color temperate of a CRT by adjusting the ratio of the electron power to the phosphors in the CRT, either by adjusting power or adjusting the on time to each of the red, green, and blue color channels of the CRT. Similar methods are used to adjust the luminance ratio of red, green, and blue emitters in emissive displays, this problem becomes somewhat more complex when additional emitters are added to the display.

However, not all displays have only red, green, and blue emitters. For example, Miller et al in U.S. Pat. No. 7,230,594, entitled "Color OLED display with improved power efficiency" discusses an OLED display having red, green, blue and an additional in-gamut emitter, wherein the efficiency of the in-gamut white emitter is significantly higher than the efficiency of the red, green, and blue emitters. As discussed in this patent, the presence of the in-gamut emitter significantly improves the power consumption of the display.

In the more than three-color emitter art, it is known to adjust the color temperature of a display having an in-gamut emitter. For example, Murdoch et al. in U.S. Pat. No. 6,897,876, entitled "Method for transforming three color input signals to four or more output signals for a color display" describes a method for driving an electro-luminescent display having red, green, blue, and white emitters to color temperatures other than the color of the white emitter. Also, in the LCD art, Higgins in U.S. Pat. No. 7,301,543 entitled "Systems and methods for selecting a white point for image displays" describes a method for adjusting the color temperature of an LCD having red, green, blue, and white emitters using a set of weighting coefficients. These methods allow the color temperature of the display to be adjusted, however, they have the disadvantage that they also have a significant effect on the power consumption of the display. For example, the method discussed by Higgins changes the ratio of light that is blocked by the LCD and in the emissive display case, the ratio of light produced by highly efficient white emitters to the ratio of light produced by lower efficiency red, green, and blue emitters of emissive displays with color filters is altered. As a result, the power consumption of the display can vary dramatically for displays having four or more emitters as the color temperature of the display is changed.

There is a need for an emissive display structure that permits the color temperature to be adjusted in emissive, specifically electro-luminescent displays having four or more color emitter systems, wherein the power efficiency of the resulting display does not vary significantly as a function of color temperature. It is further desirable to maintain high power efficiency, and therefore low display power consumption, regardless of display color temperature.

SUMMARY OF THE INVENTION

In accordance with the present invention, there is provided an EL display adapted to receive a three-color input image signal, comprising:

a) three gamut-defining EL emitters for emitting red, green, and blue colored light and a first and a second additional EL emitter for emitting two different additional colors of light having chromaticity coordinates specifying respective pseudo-blackbody points, the chromaticity coordinates of the two additional colors of light lying inside a gamut defined by the three gamut-defining emitters and near the Planckian Locus, wherein the two pseudo-blackbody points have respective correlated color temperatures that differ by at least 2000K, and wherein each EL emitter outputs light at a corresponding luminance value in response to a corresponding drive signal;

b) means for providing a display white point; and c) a controller responsive to the provided display white point and the three-color input image signal for providing first separate drive signals for the three gamut-defining EL emitters and second separate drive signals for the two additional EL emitters, wherein the respective luminance values corresponding to the second separate drive signals are each a function of the input image signal and the distances between the display white point and the pseudo-blackbody points of the two additional colors.

In accordance with another aspect of the present invention, there is provided an EL display, adapted to receive a three-color input image signal comprising:

a) three gamut-defining EL emitters for emitting red, green, and blue colored light, wherein the three gamut-defining EL emitters define a gamut and wherein each EL emitter outputs light at a corresponding luminance value in response to a corresponding drive signal;

b) three cyan, magenta and yellow additional EL emitters for respectively emitting cyan, magenta and yellow light, wherein each additional EL emitter is within the gamut and has respective chromaticity coordinates, the line between the chromaticity coordinates of the cyan EL emitter and the magenta EL emitter intersects the Planckian Locus to define a first pseudo-blackbody point, the line between the chromaticity coordinates of the yellow EL emitter and the magenta EL emitter intersects the Planckian Locus to define a second pseudo-blackbody point, and the distance between the first and second pseudo-blackbody points along the Planckian Locus is greater than 2000K, and wherein each EL emitter outputs light at a corresponding luminance value in response to a corresponding drive signal.

c) means for providing a display white point; and d) a controller responsive to the provided display white point and the input image signal for providing first separate drive signals for the three gamut-defining EL emitters and second separate drive signals for the three additional EL emitters, wherein the respective luminance values corresponding to the second separate drive signals are each a function of the input image signal and the distances between the chromaticity coordinates of the display white point and the first and second pseudo-blackbody points.

An advantage of the present invention is that it can produce images with a range of color temperatures in which high power efficiency is provided regardless of display color temperature. This provides the viewer of the display the flexibility of selecting a display color temperature without increasing the power consumption of the display, thereby maintaining high power efficiency. Some arrangements of the present invention have the added advantage that they provide multiple in-gamut light-emitting elements to extend the useful lifetime of the display device.

DETAILED DESCRIPTION OF THE INVENTION

Figure 1:
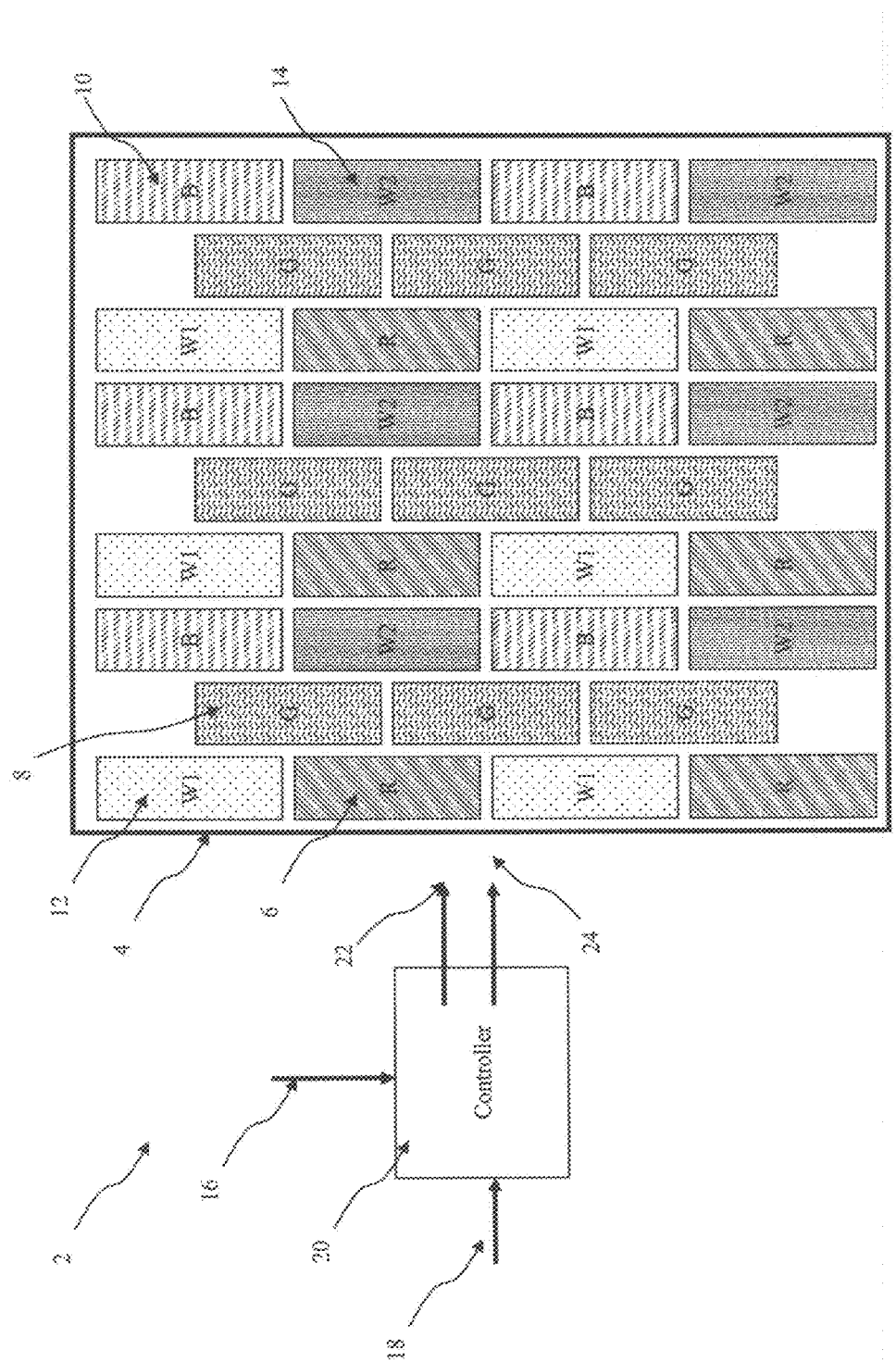
FIG. 1 is a schematic of the top view of a display system according to one arrangement of the present invention.

One arrangement of the present invention provides an EL display 2 adapted to receive a three-color input image signal 18, which includes a display panel 4, including three gamut-defining EL emitters 6, 8, 10 for emitting red, green, and blue colored light, respectively, and a first and a second additional EL emitter 12, 14 for emitting two additional colors of light having chromaticity coordinates specifying two pseudo-blackbody points, the chromaticity coordinates of the two additional colors of light lying inside a gamut defined by the three gamut-defining emitters 6, 8, 10 and near the Planckian Locus, wherein the two pseudo-blackbody points have respective correlated color temperatures that differ by at least 2000 K. Each EL emitter 6, 8, 10, 12, 14 outputs light at a corresponding luminance value in response to a corresponding drive signal. The EL display 2 further includes a way of providing a display white point; and a controller 20 responsive to the provided display white point, which the controller 20 can receive as a white point signal 16, and the input image signal 18. The controller 20 provides first separate drive signals for the three gamut-defining EL emitters 22 and second separate drive signals 24 for the two additional EL emitters 12, 14, wherein the respective luminance values corresponding to the second separate drive signals 24 are each a function of the input image signal and the distances between the display white point and the two pseudo-blackbody points of the two additional colors.

Figure 15:
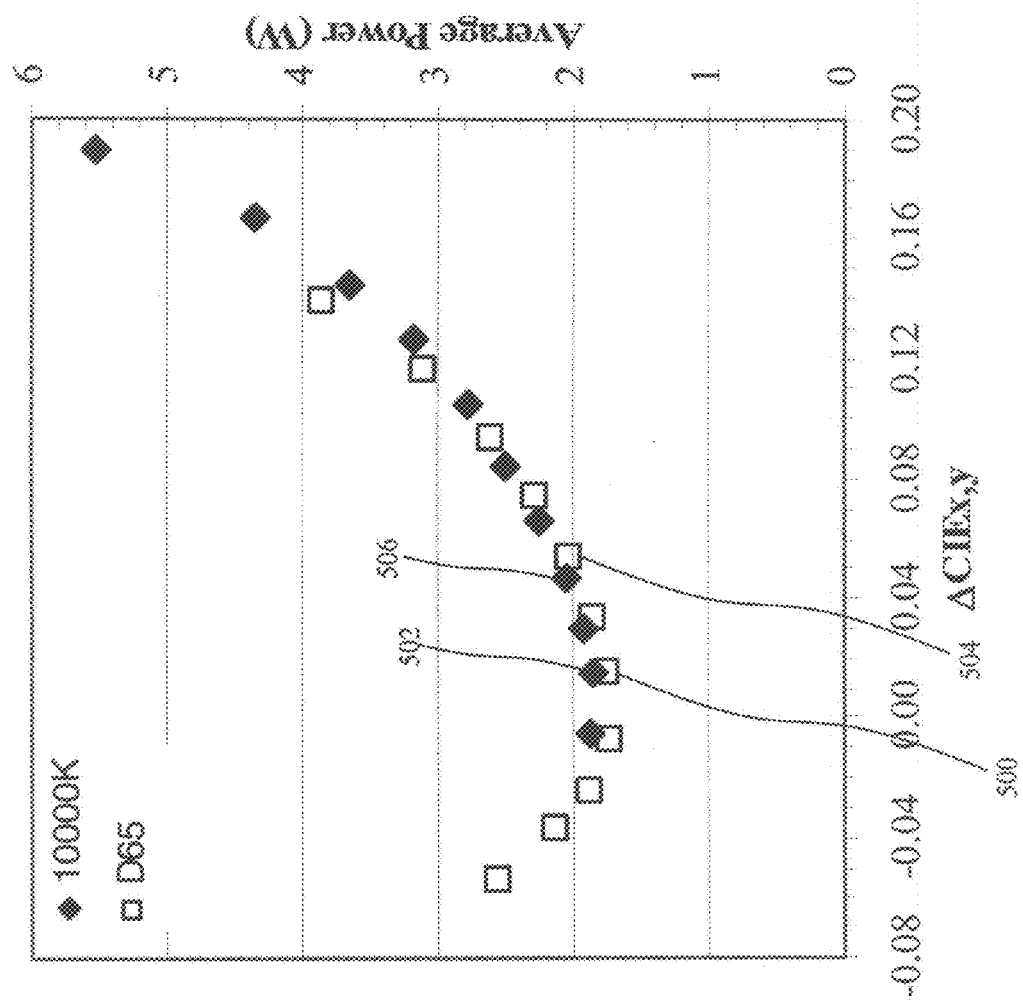
FIG. 15 is a graph of average power as a function of the distance of the chromaticity coordinates of a white emitter from the white point of the display.

Within the current invention, the two or more additional EL emitters 12, 14 are within the gamut, have a high power efficiency and are capable of producing two pseudo-blackbody points which are separated by a distance large enough to allow the pseudo-blackbody points to bracket a range of desired white points. FIG. 15 shows the average power consumption of an EL display having EL emitters for emitting red, green, blue and white light as a function of the distance of the chromaticity coordinates of the single white emitter from the desired display white point. This value is plotted for two different white EL emitters, one having a white point near D65 (e.g., color temperature of 6500 K) and one having a white point with a color temperature of 10,000 Kelvin. As this figure shows, if the display white point is D65 and the emitter has chromaticity coordinates that are near D65, the power consumption of the display will be low and often near a minimum as indicated by point 500 and increase anytime the color of the white emitter or the color of the display white point changes, such that the power is increased by more than 10 percent anytime the distance between the chromaticity coordinates in the 1931 CIE chromaticity diagram is more than 0.05, which is near the point 504. The same relationship exists if the display white point is 10,000 Kelvin and the display white point is also 10,000 Kelvin as indicated by the point 502. That is, this point 502 indicates a low power that is near the minimum power for a display white point of 10,000 Kelvin. Once again, the point 506, which has a distance near 0.05 from the display white point. The distance between these two correlated color temperatures is greater than 0.05, and therefore any display having a single white emitter, which provides images rendered with these two white points will have an increased power consumption when it is required to produce some images at one display white point and other images at a second display white point. It has been determined that when using the arrangement of EL emitters according to the present invention, the EL display 2 can render the input image signal to the EL emitters 6, 8, 10, 12, 14 of the EL display 2, such that the closest pseudo-blackbody point is used for rendering neutral colors at the desired display white point with a high efficiency.

Because most image sets contain a preponderance of neutral colors, the ability to shift the energy among the EL emitters 12, 14 that form the separate pseudo-blackbody points as the desired display white point is changed, permits the power consumption of the EL display 2 to remain relatively unchanged as a function of display white point. It has also been determined that for most typical image sets, a typical EL display 2 having only a single in-gamut EL emitter, which is near the display white point, will require this single EL emitter to have a very large aperture ratio, typically near or larger than twice the emitting area of the EL emitters 6, 8, 10 for emitting red, green, and blue light. By employing the present invention, the lifetime of the EL display 2 is improved by applying equal-sized EL emitters 6, 8, 10, 12, 14 but increasing the lifetime by providing multiple EL emitters 12, 14 inside the gamut defined by the EL emitters 6, 8, 10 for emitting red, green and blue light.

In the context of the present invention, the term "pseudo-blackbody points" refer to two or more colors of light specified by chromaticity coordinates that are "near" the Planckian locus. In a display system of the present invention having exactly two additional emitters, these pseudo-blackbody points will correspond to the colors of light that are emitted by these two additional EL emitters 12, 14, requiring that the colors of light that are emitted by these two additional EL emitters 12, 14 are "near" the Planckian Locus. In a display system of the present invention having more than two additional EL emitters 12, 14, these pseudo-blackbody points will correspond to colors of light that are created either by an individual additional EL emitter or a combination of light from at least two of the additional EL emitters. When the "pseudo-blackbody point" is created by combining light from two or more of the additional EL emitters, the EL emitters should span the Planckian Locus in such a manner that the appropriate color of light is created to create an appropriate pseudo-blackbody point that is "near" the Planckian Locus.

The term "Planckian Locus" refers to the path or locus that the color of a black body would take in a particular color space as the blackbody temperature changes. In the context of the present invention, a pseudo-blackbody point is "near" pseudo-blackbody the Planckian Locus when it is within a Euclidean distance of plus or minus 0.05 of the nearest point on the Planckian Locus, as depicted on the standard CIE 1931 chromaticity diagram. More specifically, in the context of the present invention, chromaticity coordinates that are "near" the Planckian Locus will have a Euclidean distance within the 1931 chromaticity diagram of plus or minus 0.05 from the nearest point on the Planckian Locus as specified by blackbody radiators having color temperatures between 5000 degrees and 10,000 Kelvin.

The term "correlated color temperature" is a property of a color and refers to the temperature of the Planckian radiator having the perceived color most closely resembling that of the given color at the same luminance value and under the same viewing conditions. The correlated color temperature of any color is calculated as the temperature of the blackbody radiator having the smallest Euclidean distance from the color within the 1976 CIE uniform chromaticity space. The term "radiant efficiency" within the context of the present invention is the efficiency with which electrical energy is converted to electromagnetic radiation within the visible spectrum, that is electromagnetic radiation having wavelengths between 380 and 750 nm. For EL emitters of the-present invention., this value is specified as the ratio of Watts of electromagnetic energy having wavelengths between 380 and 750 nm that is emitted from the display to the Watts of power or Amps of current provided to stimulate the EL emitters. This quantity is separate from "luminous efficacy", which is the ratio of luminous flux emitted by the EL emitter to the amount of electricity used to stimulate the EL emitter. Luminous efficacy is typically provided in terms of lumens per watt or candelas per amp, since "luminous efficacy" includes an adjustment, which reflects the varying sensitivity of the human eye to the different wavelengths of electromagnetic energy.

Figure 2:
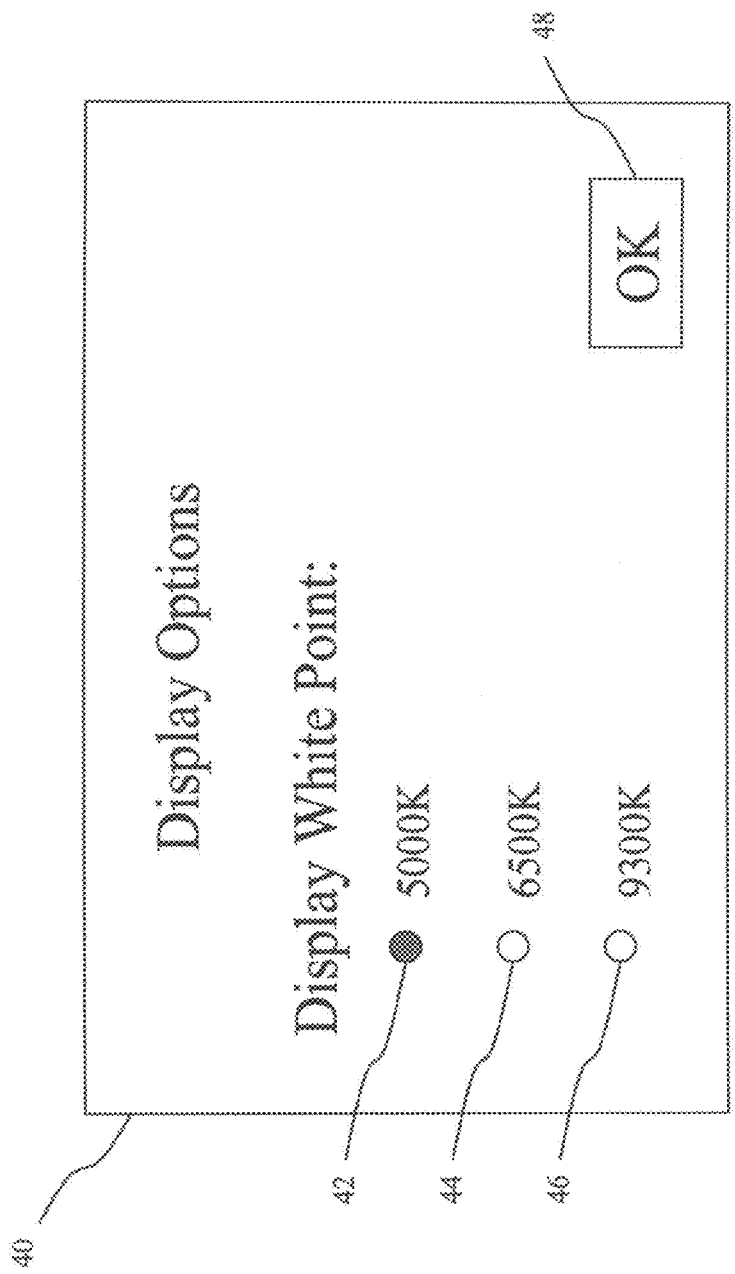
FIG. 2 is a representation of a user menu useful in providing a means for providing a display color temperature.

In the present invention, there is provided a structure for providing a display white point, which includes any apparatus for providing a white point signal 16 for specifying a display white point to the controller 20. In one arrangement, this structure includes a user menu that is provided on the EL display 2, and a user input device for selecting between or among display white point options. FIG. 2 shows one such menu 40. In this menu, the user is given multiple options 42, 44, 46 for selecting display white points. These options will commonly indicate a single selected option 42 and allow the user to use an input device, such as a mouse or a button to select one of the remaining options 44, 46. The user can also be given access to a separate control 48 for indicating that they have indicated their desired preference. These options are provided through a graphical user interface as shown in FIG. 2 in some arrangements. Alternately, the display can have a single button, which when pressed, changes the color temperature of the white point of the display. Although the menu 40 shown in FIG. 2 permits the user to explicitly select a color temperature, this explicit control is not necessary and in an alternative arrangement the user is provided with alternate options that allow the implicit control of white point selection, for example, by providing options such as cinema mode (inferring 6500K) and saturated color mode (inferring 9300K). Besides direct user manipulation of display white point, the structure for providing a display white point in other arrangements is a signal associated with the input image signal 18. For example, in some arrangements a video signal is encoded assuming a particular display white point. This display white point is encoded in metadata associated with this video signal. The video signal is provided to the display, thereby providing the display white point (encoded in the metadata) as well as the input image signal 18. Further, the controller 20 can infer the display white point based upon the source of the input image signal 18. For example an input image signal 18 provided through a standard video port (e.g., a S-video port) might be assumed to have a display white point, such as 6500K but an input image signal 18 provided through a port more closely associated with a computing platform (e.g., a VGA port) might be assumed to have a different display white point, such as 9300K.

Figure 3:
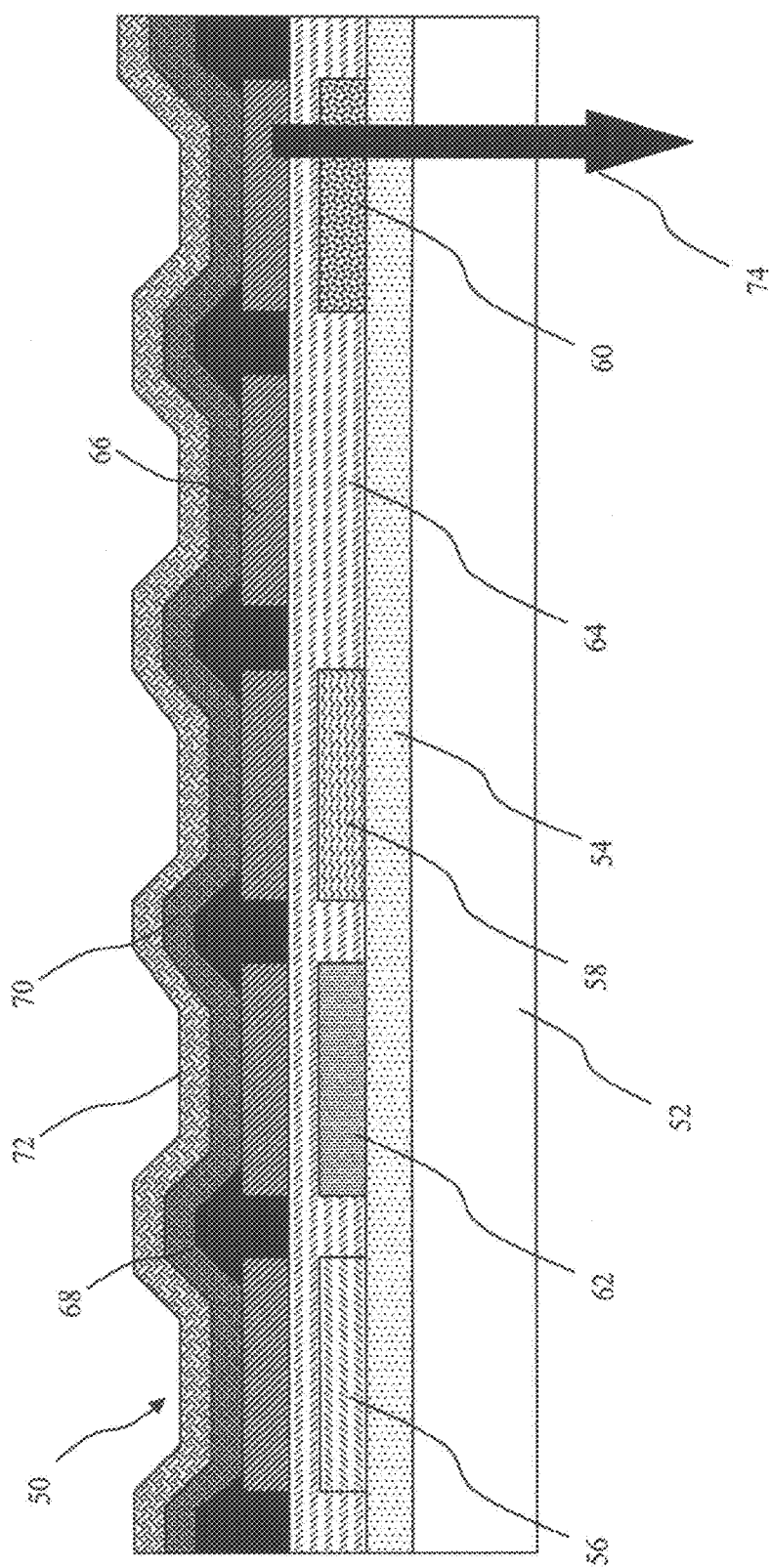
FIG. 3 is a schematic of a cross section of a portion of a display panel useful in practicing an arrangement of the present invention.

In one arrangement of the present invention, the EL display can include an EL display panel, which is formed from an EL emitter for emitting white light together with an array of color filters. Different color filters are employed to form the EL emitters for emitting red, green, blue and the two additional colors of light. A cross-section of one such display panel is shown in FIG. 3. As shown in this arrangement, the EL display panel 50 will include a substrate 52 on which a drive layer 54 is formed. This drive layer 54 will include electronics, such as active-matrix circuitry, to provide current to each light-emitter. Narrowband color filters 56, 58, 60 are then formed to filter any broadband light emission to form narrowband red, green, and blue light, respectively. In some arrangements, an additional broadband color filter 62 is formed for providing an additional color of light. A second broadband color filter (not shown) can optionally be formed for filtering any broadband light emission to form a second additional color of light, but such a color filter is not necessary. A smoothing layer 64 can additionally be provided for reducing variations in thickness in the region of the color filters. A first electrode 66 is typically formed inside the area defined by each of the color filters and an insulator 68 is typically formed between segments of the electrode to reduce shorting. An EL emissive layer 70 can then be formed over the first electrodes for emitting broadband light. This EL emissive layer 70 will typically include a multi-layer stack that will typically include at least a hole transport layer, a light-emitting layer, and an electron transport layer. The light-emitting layer 70 will typically include multiple species of light-emitting structures or molecules, each species emitting a narrowband of light with a variable wavelength for forming the broadband light emission. Finally, a second electrode 72 will be formed on the opposite side of the EL emissive layer as the first electrode 66. During operation, the first and second electrodes 66, 72 will provide an electrical potential, motivating the flow of current through the EL emissive layer 70 and the EL emissive layer 70 will emit broadband light in response to the current that passes through this layer. In such a structure, the second electrode 72 will typically be formed from a reflective metal, such as aluminum. The first electrode 66 will typically be formed from a transparent oxide, such as indium Tin Oxide and the light emitted by the EL emissive layer 70 will typically be emitted in the direction 74 indicated by the arrow. However, this is not required as the color filters can be formed on the opposite side of the second electrode 72 and the second electrode 72 can be transparent or semi-transparent and the first electrode 66 can be reflective. The individual EL emitters within the EL display 50, depicted as 6, 8, 10, 12, and 14 of FIG. 1, are defined by a pattern of the first and second electrodes 66, 72 such that an individual EL emitter is formed by overlapping regions of the first and second electrodes 66, 72, which will be patterned to define a two-dimensional array of EL emitters. As shown, this device includes color filters 56, 58, 60 for each of the three gamut defining emitters and a color filter 62 for one of the two additional emitters.

Figure 4:
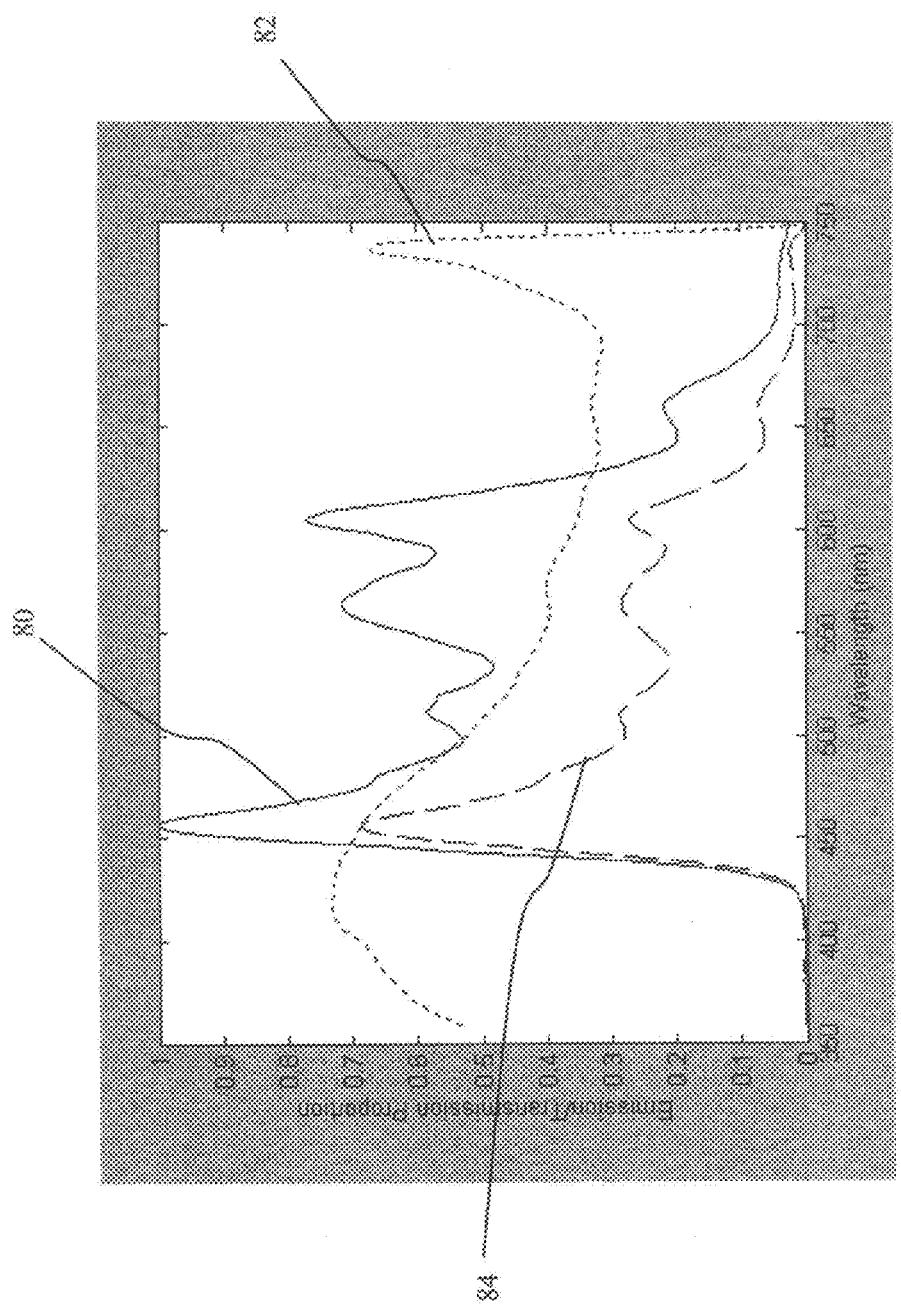
FIG. 4 is a plot of emitter spectral emission and color filter transmission spectra for emitters and color filters useful in practicing an arrangement of the present invention.

The broadband light provided by the EL emissive layer 70 can provide a spectrum, such as 80 in FIG. 4. One of the additional EL emitters 12, 14 in FIG. 1 can emit this light without a color filter, provided the spectrum of light is such that it has chromaticity coordinates that are inside the gamut of the gamut-defining EL emitters 6, 8, 10 and near the Planckian Locus. Light having the spectrum 80 shown in FIG. 4 will have chromaticity coordinates 0.326, 0.346, which have an Euclidean distance of 0.005 from the Planckian Locus at a correlated color temperature of 5800 Kelvin. The second additional EL emitter 12, 14 will include some form of color filter. This color filter, for example 62 in FIG. 3, is a dye or pigment based color filter having a spectrum 82 in FIG. 4. However, this filter can be formed through the design of optical interference within the layers of the device or other known structures. Employing a color filter having the spectrum 82, in combination with the EL spectrum 80 shown in FIG. 4 will result in an EL emitter having the spectrum 84. Light having the spectrum 84 will have chromaticity coordinates 0.275, 0.290, which have a Euclidean distance of 0.0016 from the Planckian Locus at a correlated color temperature of 10,500 Kelvin.

Figure 5:
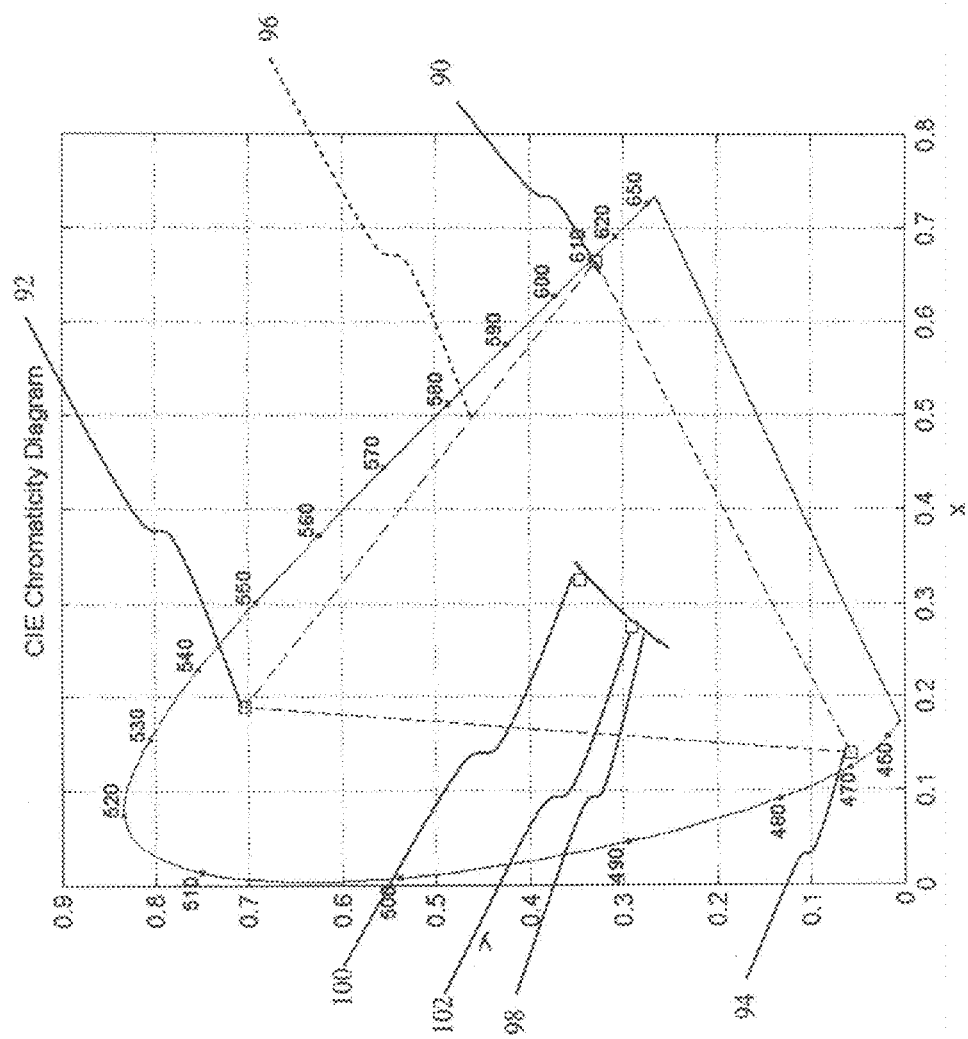
FIG. 5 is a 1931 CIE chromaticity diagram providing the location of color coordinates for EL emitters according to an arrangement of the present invention.

When the EL emissive layer 70 provides light having the spectrum 80 and is employed without a color filter and with a color filter having the spectrum 82 to create the two additional emitters as well as employed with three typical narrowband filters, the resulting EL display will provide EL emitters for producing colors having the 1931 CIE chromaticity coordinates provided in FIG. 5. As shown in this figure, by selecting appropriate narrowband color filters for passing long, medium and short wavelength light, the corresponding gamut-defining EL emitters produce light having chromaticity coordinates 90, 92, and 94 for the red, green, and blue EL emitters. These coordinates define a color gamut 96, which specifies the colors that can be formed through combinations of these three colors of light. FIG. 5 also shows a portion of the Planckian locus 98 for color temperatures between 5000 and 25000 Kelvin. The chromaticity coordinates 100 and 102 provided by light having the spectrum 80 and 84, respectively are also shown and provide pseudo-blackbody points according to the present invention. These pseudo-blackbody points besides lying inside the gamut provided by the gamut-defining primaries are near the Planckian Locus, also have correlated color temperatures that differ by more than 2000 Kelvin with one of the pseudo-blackbody points of one of the additional emitters having a correlated color temperature of 6500 Kelvin or less and the second pseudo-blackbody point of the second of the additional emitters having a correlated color temperature of 8000 Kelvin or greater. Within this configuration, because narrow bandpass filters filter the gamut-defining primaries, these narrow bandpass filters reduce their final radiant efficiency significantly. For a broadband emitter having an efficiency of 0.0122 W/A, the red, green, and blue EL emitters have radiant efficiencies of 0.00225, 0.00163, and 0.00220 W/A. However, because the additional EL emitters are not filtered or are filtered using a broadband filter, they have significantly higher radiant efficiencies, having radiant efficiencies of 0.00642 and 0.0122 W/A. Therefore, each EL emitter has a respective radiant efficiency and the radiant efficiencies of the two additional emitters are each higher than all of the respective radiant efficiencies of the gamut-defining EL emitters.

Figure 6:
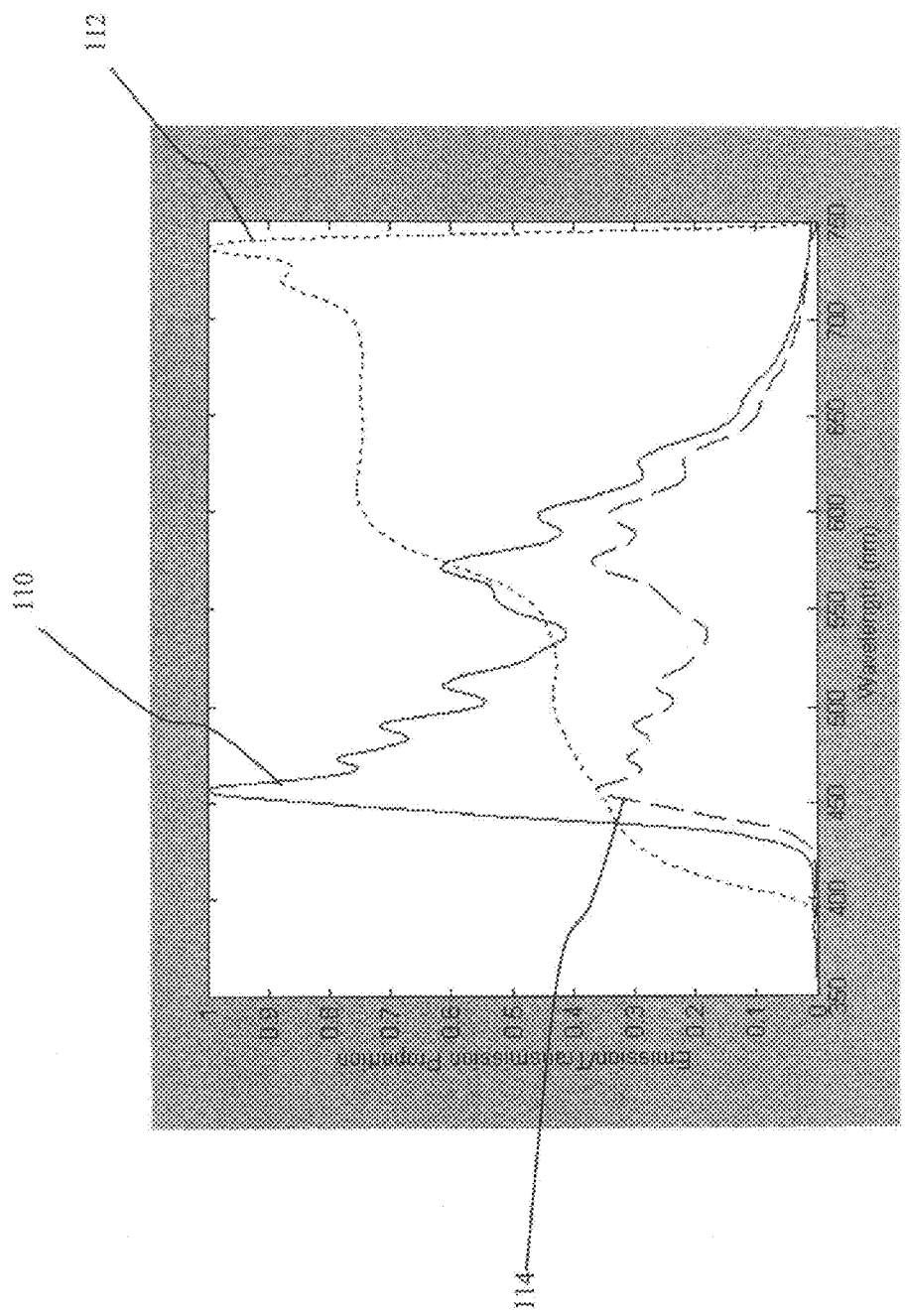
FIG. 6 is a plot of emitter spectral emission and color filter transmission spectra for emitters and color filters useful in practicing an arrangement of the present invention.
Figure 7:
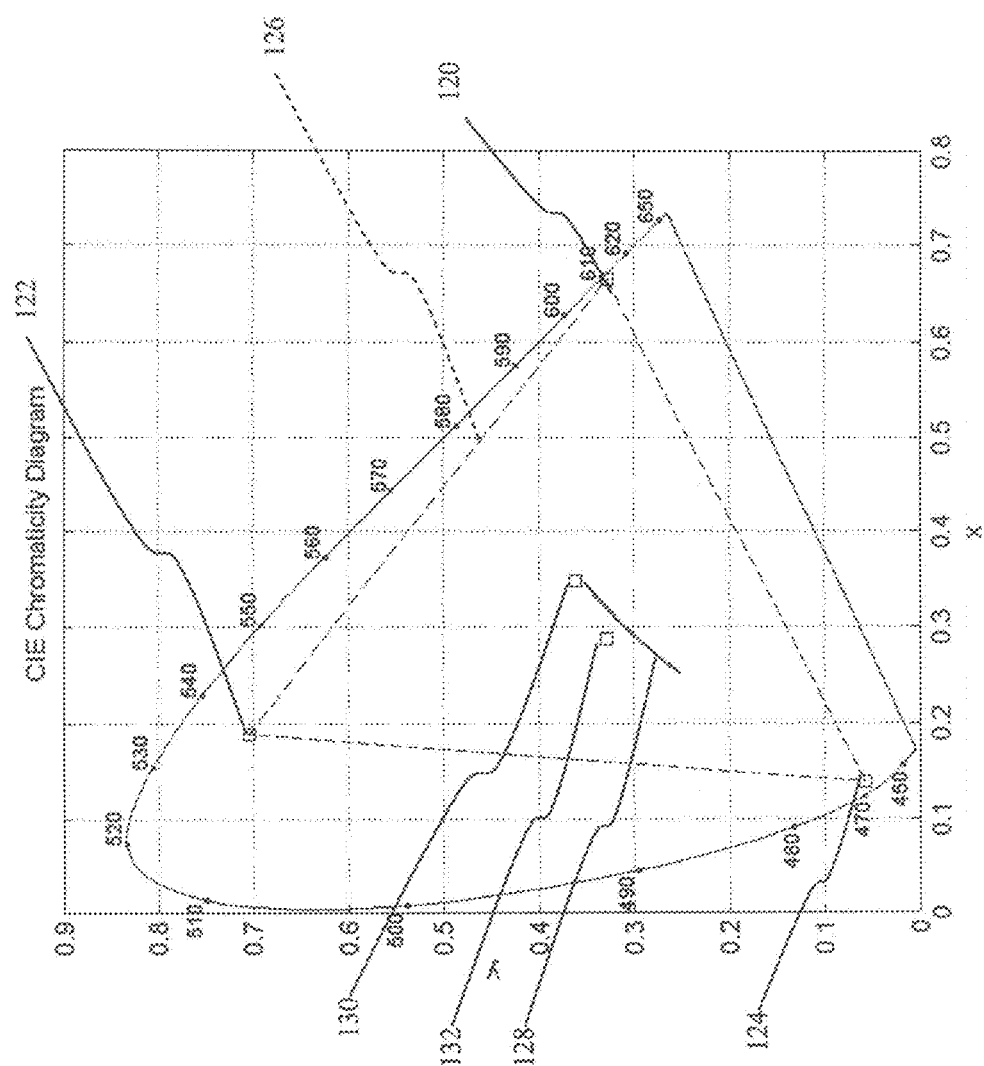
FIG. 7 is a 1931 CIE chromaticity diagram providing the location of color coordinates for EL emitters according to an arrangement of the present invention.

In the previous example, the EL emissive layer 70 within the EL display 50 was assumed to have spectral emission 80 with a low correlated color temperature and a color filter 62 was used to alter the emitted light such to achieve a higher color temperature. However, this is not required and a system of the present invention is formed using an emitter that natively has a high correlated color temperature with a color filter to obtain a lower correlated color temperature. FIG. 6 provides an emitter spectrum 110 for an EL emitter having a high correlated color temperature, specifically 8000 Kelvin, and the spectrum of a filter 112 for reducing the short wavelength energy from the emitter spectrum 110. By applying this filter, to filter the emitter spectrum 110 of the EL emitter, the filtered emitter spectrum 114 is obtained for an EL emitter in combination with the color filter having the color filter spectrum 112 with a correlated color temperature of 4900 Kelvin. By providing an EL emission layer 70 in FIG. 3 having the emitter spectrum 110 together with a color filer 62 in FIG. 3 having the color filter spectrum 112 together with typical color filters 56, 58, 60 to form red, green, and blue light, the chromaticity coordinates shown in FIG. 7 is obtained. As shown, typical color filters together with the emitter spectrum 110 will result in red, green, and blue emission having the chromaticity coordinates 120, 122, 124, which form the color gamut 126. By applying a color filter having filter spectrum 112 within one of the additional EL emitters, the chromaticity coordinates 130 are obtained and the unfiltered EL emission having the spectrum 110 will provide the chromaticity coordinates 132, each of which are near the Planckian Locus 128. With this combination, the Euclidean distance of the unfiltered emitter has a distance of 0.020 from the Planckian Locus and the filtered emitter has a distance of 0.0012 from the Planckian Locus. The resulting EL emitters have relative radiant efficiencies of 0.0099, 0.0104, and 0.0156 W/A for the gamut defining EL emitters and 0.073 and 0.0366 W/A for the additional EL emitters.

Although, at least one of the additional EL emitters are formed to include a color filter in the previous arrangement, this is not a necessary requirement. In another arrangement of the present invention shown in FIG. 8, an EL display panel 140 is formed from an EL emitter for emitting white light together with an array of color filters. As shown, different color filters are employed to form the EL emitters for emitting red, green, and blue light. In other arrangements, the color of the additional EL emitters are, however, formed using other methods, such as by tuning the length of optical cavities within the EL display panel 140. As shown, the EL display panel 140 will typically include a substrate 142 on which a drive layer 144 is formed. This drive layer 144 will include electronics, such as active-matrix circuitry, to provide current to each elemental emitter. A first electrode 146 is formed with an insulator 148 between segments of the electrode to reduce shorting.

A variable-thickness, non-emitting layer 166 is formed over the first electrode 146. This variable-thickness, non-emitting layer will be relatively transparent and will have a different thickness in the first additional EL emitter, for example the one indicated by region 168, than in the second additional EL emitter, for example the one indicated by region 170. The purpose of this variable-thickness, non-emitting layer 166 is to introduce a different optical cavity length within the optical structure of the EL display device.

An EL emissive layer 150 can then be formed over the first electrodes and the variable-thickness, non-emitting layer 166 for emitting broadband light. This EL emissive layer 150 will typically include a multi-layer stack that will typically include at least a hole transport layer, a light-emitting layer, and an electron transport layer. The light-emitting layer within the EL emissive layer 150 will typically include multiple species of light-emitting structures or molecules, each species emitting a narrowband of light with a variable wavelength for forming the broadband light emission. A second electrode 152 will be formed on the opposite side of the EL emissive layer as the first electrode 146. During operation, the first and second electrodes 146, 152 will provide an electrical potential, motivating the flow of current through the EL emissive layer 150 and the EL emissive layer 150 will emit broadband light in response to the current that passes through this layer. In such a structure, the second electrode 152 will typically be formed from a transparent or semi-transparent material, including materials such as Indium Tin Oxide or thin silver. The first electrode 146 will typically be formed from a reflective metal, such as Aluminum. The device can then be designed to include a low optical index layer, 176, for example an air gap above the second electrode 152 within the regions of light emission. This low optical index layer 176 is formed, for example, by applying a second substrate 162 above the second electrode 152. This second substrate 162 is made to include narrow band color filters 154, 156, and 158 for filtering the broadband light emitted from the light-emitting layer 150 together with a smoothing layer 160 in this arrangement. In this arrangement, the narrowband color filters 154, 156, 158 filter broadband light emission to provide red, green, and blue light.

This arrangement permits light produced in the EL emissive layer 150 to be emitted in the direction of the arrow 164. Narrowband color filters 154, 156, 158 are then formed to filter any broadband light emission to form narrowband red, green, and blue light, respectively. A second broadband color filter (not shown) can optionally be formed for filtering any broadband light emission to form one or both of the additional EL emitters, but such a color filter is not necessary.

Further detail can now be provided with regards to the variable-thickness, non-emitting layer 166. By selecting the thickness of this variable-thickness, non-emitting layer, the optical cavity length for each EL emitter is designed to preferentially emit certain wavelengths of light as compared to others. Within a device of the present invention, the optical cavity length will be selected by changing the thickness of this variable thickness, non-emitting layer 166 such that a first of the additional EL emitters, such as the one indicated by region 170, preferentially emits short wavelength light. The second of the additional EL emitters preferentially emits medium or long wavelength light. In a device, such as this, the optical cavity length is the distance from the top of the first electrode 146 (i.e., the interface between the first electrode 146 and the EL light-emitting layer 150) and the top of the second electrode 152 (i.e., the interface between the second electrode layer 152 and low optical index layer 176. As such, this non-emitting layer 166 has a different thickness in the first additional EL emitter region 168 than the second additional EL emitter region 170. In one arrangement, this non-emitting layer 166 is a transparent inorganic conductor. For example, a metal oxide, such as Indium Tin Oxide is patterned on top of the first electrode 146 using known methods to form this variable-thickness non-emitting layer 166. In another example, wherein the EL emitting layer contains organic compounds, this variable-thickness non-emitting layer 166 is an organic semiconductor, such as NPB, which is patterned through a shadowmask or through laser transfer techniques. In yet other arrangements, particularly arrangements, wherein the EL emitting layer contains inorganic materials, such as quantum dots, this variable thickness non-emitting layer 166 is an inorganic semiconductor.

By varying the thickness of this variable-thickness non-emitting layer 166 between the first and second additional EL emitter regions 168, 170, it is possible to provide two additional colors of light having chromaticity coordinates specifying pseudo-blackbody points according to the present invention. It is further advantageous, however, to also vary the thickness of this layer 166 among the EL emitters for emitting red, green, and blue light. Specifically, the efficiency of the red, green, and blue EL emitters is improved when the thickness of the non-emitting layer 166 within the gamut-defining EL emitter for forming blue light, indicated by region 174 is closer to the thickness of the non-emitting layer 166 within the additional EL emitter with the higher color temperature, indicated by region 170, than to the thickness of the non-emitting layer within the additional EL emitter with the lower color temperature. The formation of an EL emitter having a higher color temperature is achieved by designing the cavity length to preferentially emit short wavelength light, particularly light having a wavelength of 420 nm or lower. To reduce the number of steps necessary to complete a display of the present invention, when the first additional EL emitter in region 168 has a higher correlated color temperature higher than the EL emitter in the second additional EL emitter region 170, the thickness of the variable thickness, non-emitting layer within the gamut-defining EL emitter for emitting blue colored light will be equal to the thickness of the non-emitting layer within the first additional EL emitter region 168. It is further useful for the thickness of the non-emitting layer within the gamut-defining EL emitter for forming red or green light, indicated by region 172a, 172b to be closer to the thickness of the non-emitting layer within the additional EL emitter, indicated by region 168, with the lower color temperature than to the thickness of the non-emitting layer within the additional EL emitter with the higher color temperature. The formation of an EL emitter with a lower color temperature is obtained by designing the cavity length to preferentially emit medium or long wavelength light, particularly light having a wavelength between 500 and 600 nm. Once again, to reduce the number of steps required to make this variable thickness layer, when the EL emitter in the first additional EL emitter region 168 has a higher correlated color temperature than the EL emitter in the second additional EL emitter region 170 the thickness of the non-emitting layer within the gamut-defining EL emitter for emitting red or green colored light will be equal to the thickness of the non-emitting layer within the second additional EL emitter region 170. In a particularly preferred arrangement, the thickness of the non-emitting layer within both the regions 172a, 172b of the gamut-defining EL emitters for emitting red and green colored light will be equal to the thickness of the non-emitting layer within the second additional EL emitter 170.

Figure 8:
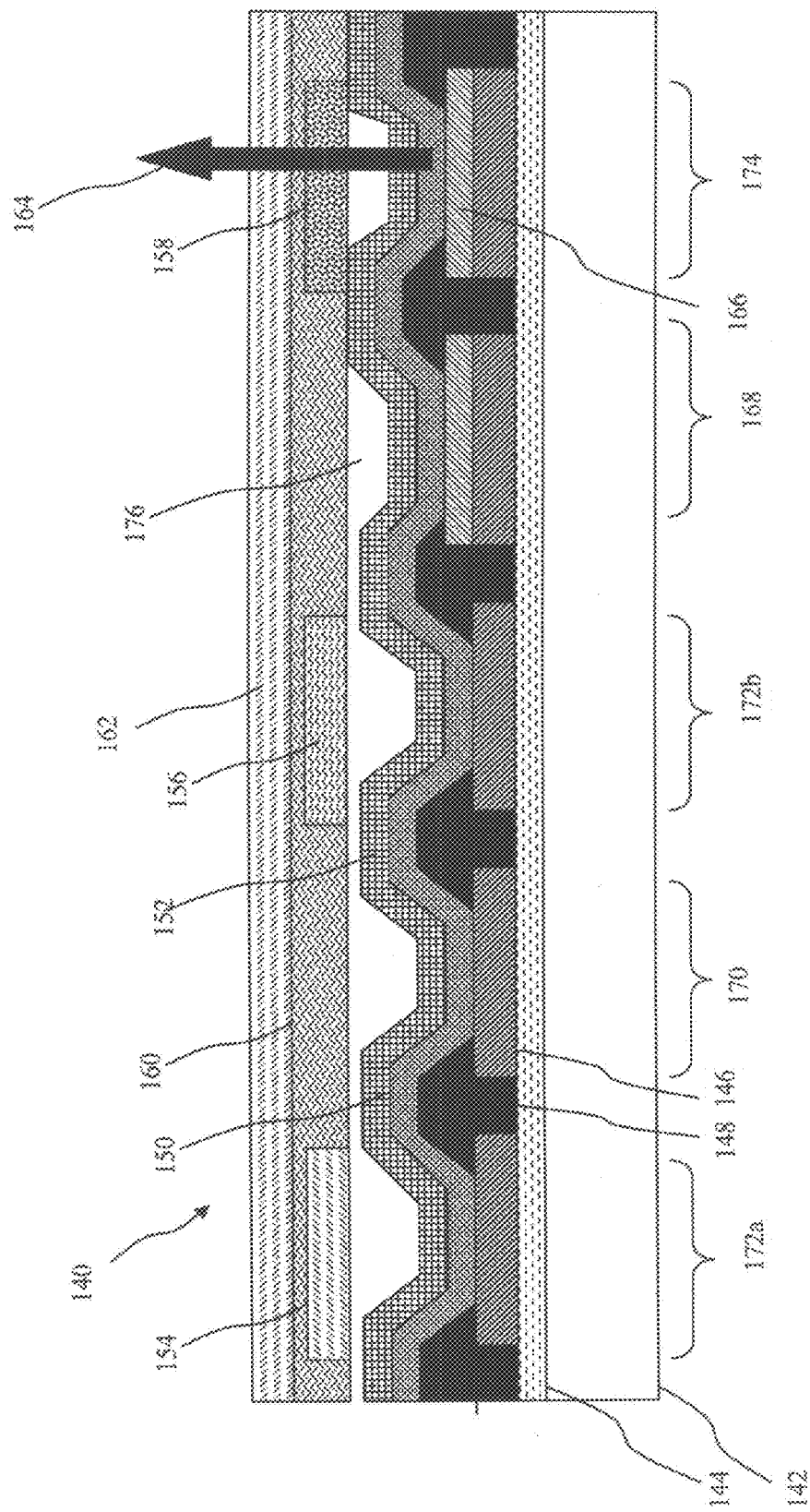
FIG. 8 is a schematic of a cross section of a portion of a display panel useful in practicing an arrangement of the present invention.

The device shown in FIG. 8 employs a top-emitting structure for emitting light in the direction opposite the substrate. However, this is not necessary and the variable thickness non-emitting layer 166 is employed in bottom emitting structures to achieve some arrangements of an EL display of the present invention. Although, it is sometimes simpler to include a very low optical index layer 176 in an appropriate location within a top-emitting EL device as shown in FIG. 8, it is not necessary for the low optical index layer 176 to have an optical index as low as air since only a relatively small color change is required between the first and second additional EL emitter regions 168, 170 of the present invention. Therefore, the inclusion of solid-state materials within layers of the device is useful in forming the low optical index layer 176 as long as the optical index of these materials is lower than the optical index of the light-emitting layer 150. In a bottom-emitting OLED device, materials typically formed within the drive layer 144 can provide the low optical index layer 176.

To fully appreciate the present invention, it is necessary to return again to a discussion of the controller 20 in FIG. 1. As discussed earlier, this controller 20 is responsive to the provided display white point, which is provided in signal 16 and the input image signal 18 for providing first separate drive signals 22 for the three gamut-defining EL emitters 6, 8, 10 and second separate drive signals 24 for the two additional EL emitters 12, 14, wherein the respective luminance values corresponding to the second separate drive signals are each a function of the input image signal and the distances between the display white point and the pseudo-blackbody points of the two additional EL emitters 12,14. Specifically, when the input image signal corresponds to the provided display white point, the controller will provide second separate drive signals such that the additional EL emitter having a pseudo-blackbody point closest to the chromaticity coordinates of the provided display white point has a higher luminance value than the additional emitter having the pseudo-blackbody point furthest from the chromaticity coordinates of the provided display white point. The controller 20 can employ numerous methods to achieve this result.

Figure 9:
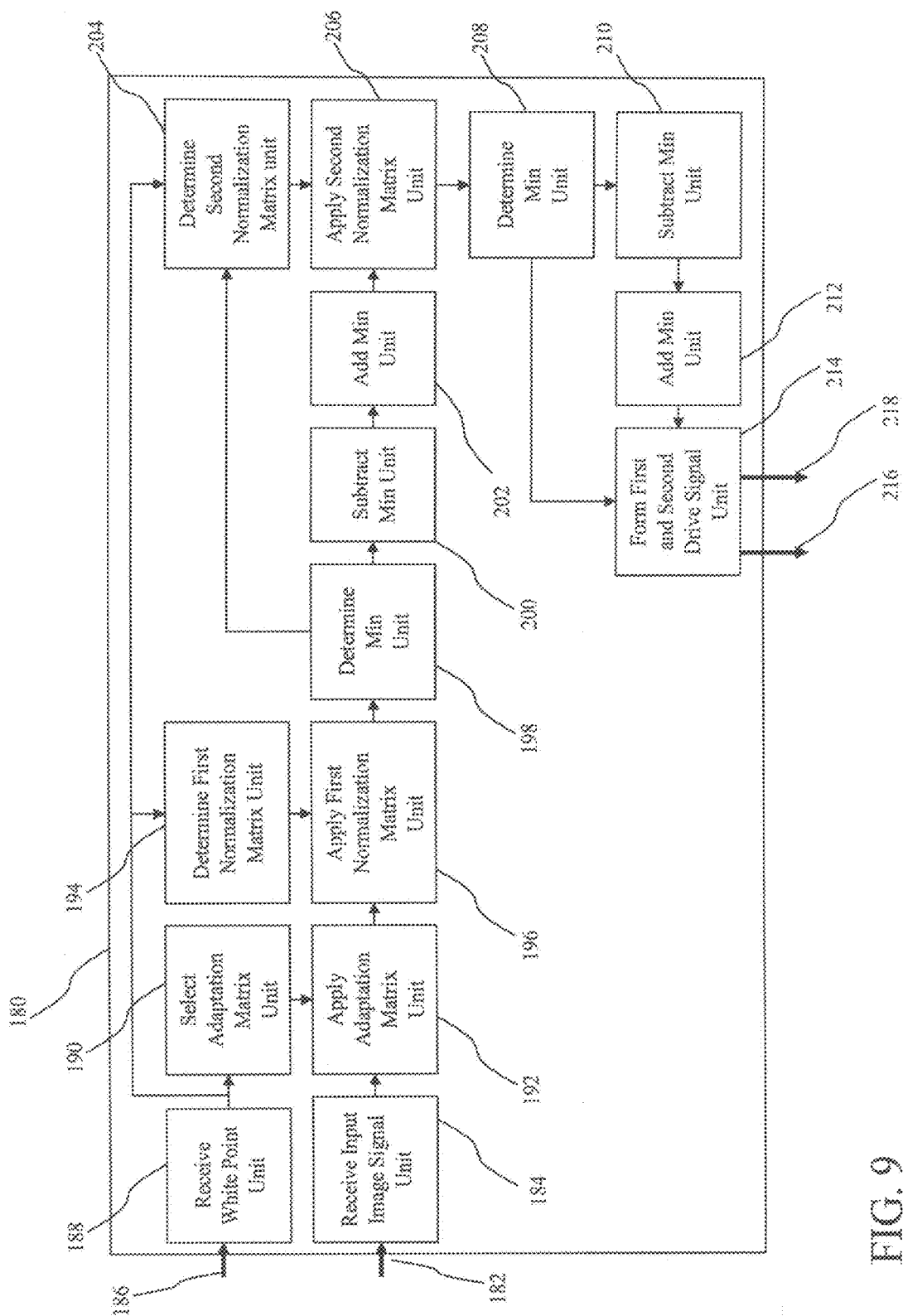
FIG. 9 is a schematic diagram of a controller according to an arrangement of the present invention.

A controller useful within the EL display of the present invention is shown in FIG. 9. As shown, the controller 180 includes a receive input image signal unit 184 for receiving the input image signal 182. This unit can perform any basic decoding steps, such as decompressing the input image signal 182 and converting the input image signal 182 to a three-color channel linear intensity using methods that are well known in the art. A receive white point unit 188 is also provided to receive a signal 186 indicating the color of the desired display white point. Based upon the desired display white point, the selected adaptation matrix unit 190, selects a color transform, typically a three by three matrix for rotating the input image signal to the desired display white point. The apply adaptation matrix unit 192 then applies this transform to the decoded input image signal to normalize the input image signal to the desired display white point. Based upon the display white point that is received by the receive white point unit 188, the determine first normalization matrix unit 194 then selects an appropriate normalization matrix. During this selection process, the unit 194 determines which of the two additional EL emitters has a pseudo-blackbody point furthest from the chromaticity coordinates of the display white point and selects or computes a matrix to rotate the output of the apply adaptation matrix unit 192 from the display white point to the chromaticity coordinates of the additional EL emitter having a pseudo-blackbody point furthest from the display white point. The determined matrix is then applied to the input data stream after application of the adaptation matrix by the apply first normalization matrix unit 196. A minimum value of the three color channel is then determined for each pixel in the image signal after application of the first normalization matrix by the determine min unit 198. A subtract min unit 200 is then used to subtract the minimum value from the each channel of the three channel signal for each pixel after application of the first normalization matrix. This minimum value is then added to the intensity for an additional color channel corresponding to the EL emitter having a pseudo-blackbody point furthest from the chromaticity coordinates of the desired display white point by the add min unit 202. The determine second normalization matrix unit 204 then determines a matrix to rotate the color coordinates of the three nonzero color components to the color of the second pseudo-blackbody point. The apply second normalization matrix unit 206 then applies this matrix to rotate the color coordinates of the three nonzero color components after the Add Min Unit 202 to the pseudo-blackbody point of the EL emitter having chromaticity coordinates closest to the chromaticity coordinates of the desired display white point. A second determine min unit 208 again determines the minimum of the resulting three nonzero channels for each pixel. This minimum is then subtracted from the signal that is acquired after applying the second normalization matrix unit by the subtract min unit 210. An add min unit 212 is then applied to add this minimum value to the fifth color channel corresponding to the EL emitter having chromaticity coordinates nearest the chromaticity coordinates of the display white point 132. The two zero values that are provided by the subtract min units 200, 212 together with the nonzero value for the resulting value for the remaining three color channel in the input image signal is then used to form a first drive signal 216 by the form first and second drive signal unit 214. The values for the two additional channels are then used to form the second drive signal 218 by the form first and second drive signal unit 214. Besides formatting this data appropriately, this unit 214 will also apply any transforms necessary to convert the linear intensity values provided by the add min unit 212 to code values, voltages, or currents that are used to drive the EL emitters within the EL display. When this method is applied appropriately and the input image signal is a typical RGB signal having equal R, G, and B values (i.e., the input color is white and therefore corresponds to the provided display white point), and when the pseudo-blackbody point for one of the emitters is equal to or very near the desired display white point the first and second drive signals will drive practically all of the display luminance through the EL, emitter having a pseudo-blackbody point that is near or equal to the display white point. Therefore, the additional emitter having a pseudo-blackbody point closest to the chromaticity coordinates of the provided display white point produces higher luminance values than the additional emitter having the pseudo-blackbody point furthest from the chromaticity coordinates of the provided display white point.

Figure 10:
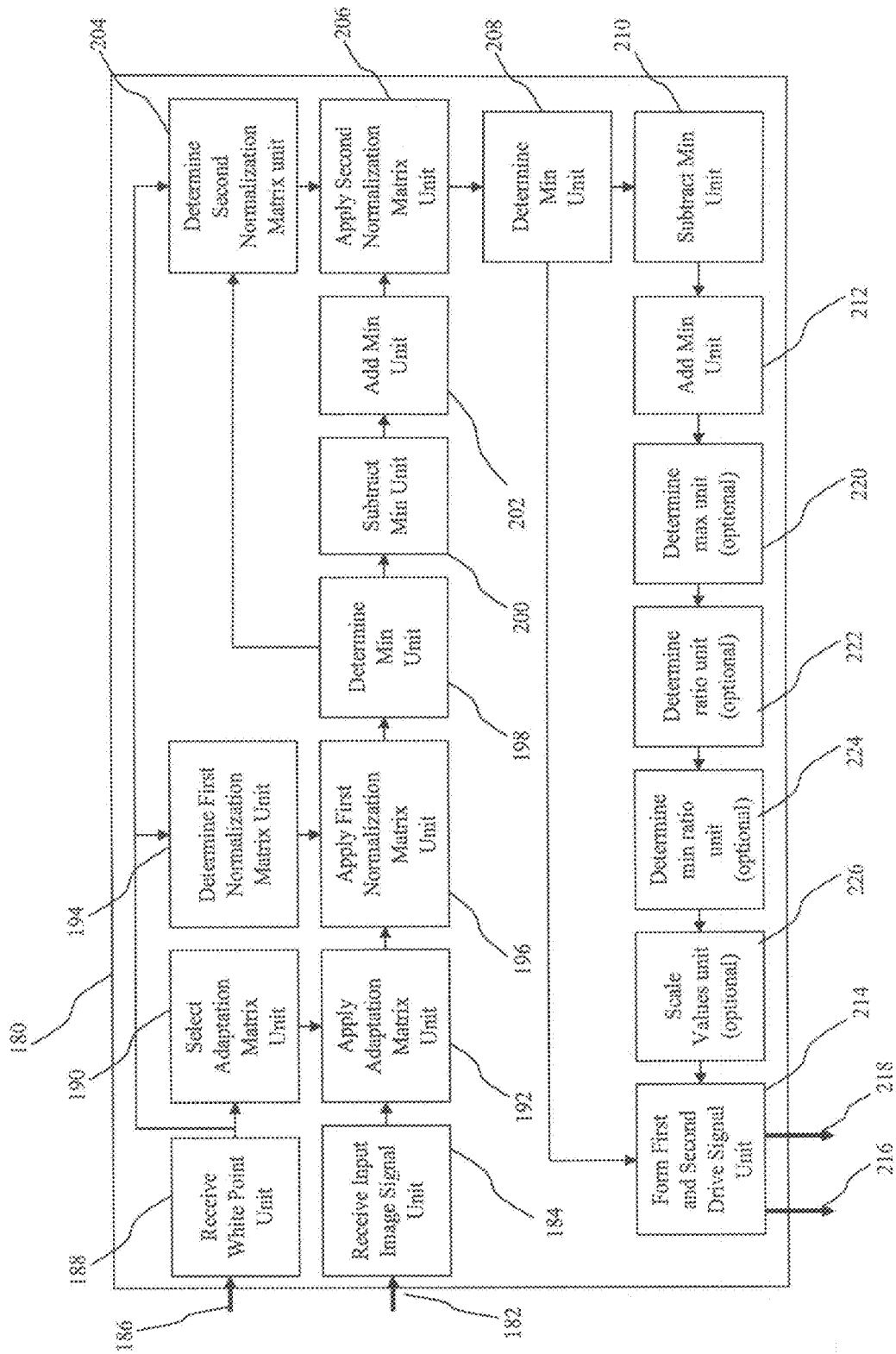
FIG. 10 is a schematic diagram of a controller according to an alternate arrangement of the present invention.

In some arrangements of the present invention, the controller can perform additional image processing steps. For example, the display white point can have a corresponding luminance value that is either specified or inferred and the controller can adjust the luminance value of the display white point in response to the input image signal. In one example, the input image signal 182 can contain three color channels for an array of pixels that compose a series of image or video frames. The controller 180, can additionally include optional units 220, 222, 224, and 226 as shown in FIG. 10. The determined max unit 220 can determine the maximum non-zero intensity values in each frame for each channel after the add min unit 212 performs its calculations. The determine ratio unit 222 can then calculate ratios between the maximum possible intensity values and the maximum non-zero intensity values for each channel in each frame. The determine min ratio unit 224 can then determine the minimum of these ratios. Finally, the scale values unit 226 can scale the intensity values resulting from the add min unit 212 by the minimum ratio as determine by the determine min ratio unit 224. This scale value will always be greater than or equal to 1. Therefore, the controller 180 in FIG. 10 will adjust the luminance value of the display white point for each frame in response to a saturation of the input image signal since images containing bright saturated colors will tend to have lower minimum ratio values. Similar methods for adjusting the luminance value of the display white point in response to the input image signal have been discussed in U.S. patent application Ser. No. 12/174,085, filed Jul. 16, 2008 entitled "Converting Three-Component To Four-Component Image" to Ronald S. Cok et al hereby included by reference.

One of the primary advantages of the present invention is that the display consumes similar amounts of power as the white point of the display is modified. Employing a display panel having emission similar to that shown in FIG. 6, a display is constructed having only a single additional EL emitter as is known in the prior art for emitting light inside the gamut or with the two additional EL emitters of the present invention. Power for each of these displays is shown in Table 1 as a function of display white point. In this example, the single white emitter in the RGBW system has a correlated color temperature of 8000 Kelvin. Therefore, when an RGBW display is constructed using this single white emitter, the minimum power of the display occurs for color temperatures near 8000 Kelvin and increases for other color temperatures. As shown, the power consumption is 3.9 W when the white point of the display is 10,000 Kelvin and increases to 4.35 W when the color temperature of the display is set to 6500 degrees K, increasing by over 10 percent. However, when the second additional emitter is provided in the inventive example, the power increases from only 3.65 W at 10,000K to 3.73 W at 6500K, only a 2% change in power. Further the power consumption is lower in general when the second emitter is added, providing 14 percent lower power at the 6500 degree Kelvin condition.

|  | 6500 K | 7500 K | 10,000 K |
| --- | --- | --- | --- |
| RGBW | 4.35 W | 4.05 W | 3.90 W |
| Inventive Example | 3.73 W | 3.61 W | 3.65 W |

Figure 11:
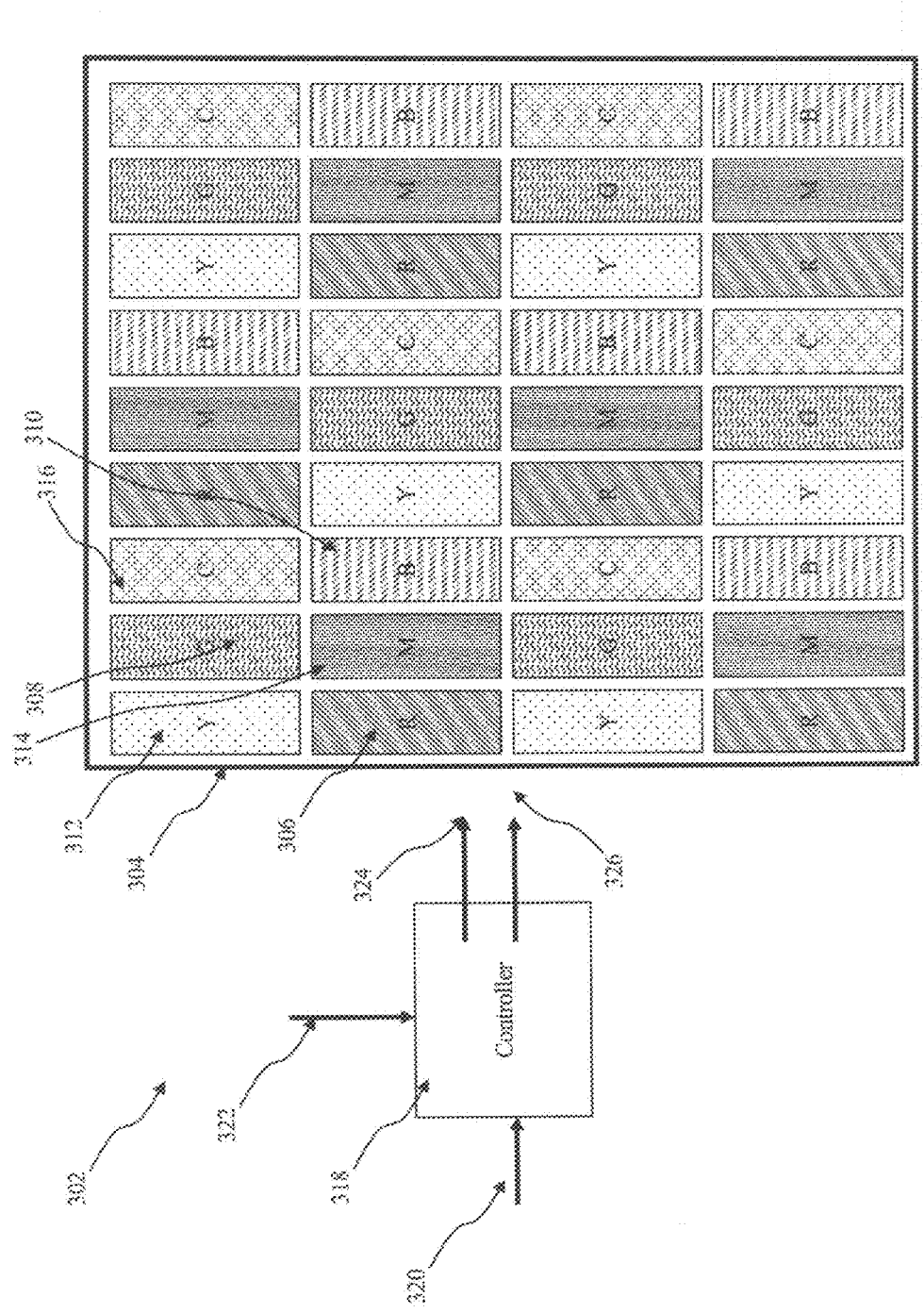
FIG. 11 is a schematic of the top view of a display system according to one arrangement of the present invention.

In another arrangement, the EL display 302 in FIG. 11 of the present invention is adapted to receive a three-color input image signal 320. This EL display 302 includes three gamut-defining EL emitters 306, 308, 310 formed on a substrate 304 for emitting red, green, and blue colored light, respectively. The chromaticity coordinates of the three gamut-defining EL emitters define a gamut and each EL emitter outputs light at a corresponding luminance value in response to a corresponding drive signal. Also included are three additional (cyan, magenta, and yellow) EL emitters 316, 314, 312 for respectively emitting cyan, magenta, and yellow light. In this EL display 302 each additional EL emitter 312, 314, 316 is within the gamut of the gamut-defining primaries 306 308, 310 and has respective chromaticity coordinates. Within this EL display, a line drawn between the chromaticity coordinates of the cyan EL emitter 316 and the magenta EL emitter 314 will intersect the Planckian Locus to define a first pseudo-blackbody point. A line drawn between the chromaticity coordinates of the yellow EL emitter 312 and the chromaticity coordinates of the magenta EL emitter 314 will intersect the Planckian Locus to define a second pseudo-blackbody point. The distance between the first and second pseudo-blackbody points along the Planckian Locus will be greater than 2000K. Each of the additional EL emitter outputs light at a corresponding luminance value in response to a corresponding drive signal. The EL display 302 will further include a structure for providing a display white point in response to a white point signal 322; and a controller 318 responsive to the provided display white point and the input image signal 320 for providing first separate drive signals 324 for the three gamut-defining El emitters 306, 308, 310 and second separate drive signals 326 for the three additional EL emitters 312, 314, 316. Within the present invention the respective luminance values corresponding to the second separate drive signals 316 are each a function of the input image signal 320 and the distances between the chromaticity coordinates of the display white point and the first and second pseudo-blackbody points. In some arrangements, when the input image signal 320 corresponds to the provided display white point, the sum of the luminance values of the additional emitters defining a pseudo-blackbody point closest to the chromaticity coordinates of the provided display white point is higher than the sum of the luminance values of the additional emitters defining a pseudo-blackbody point furthest from the provided display white point.

Figure 12:
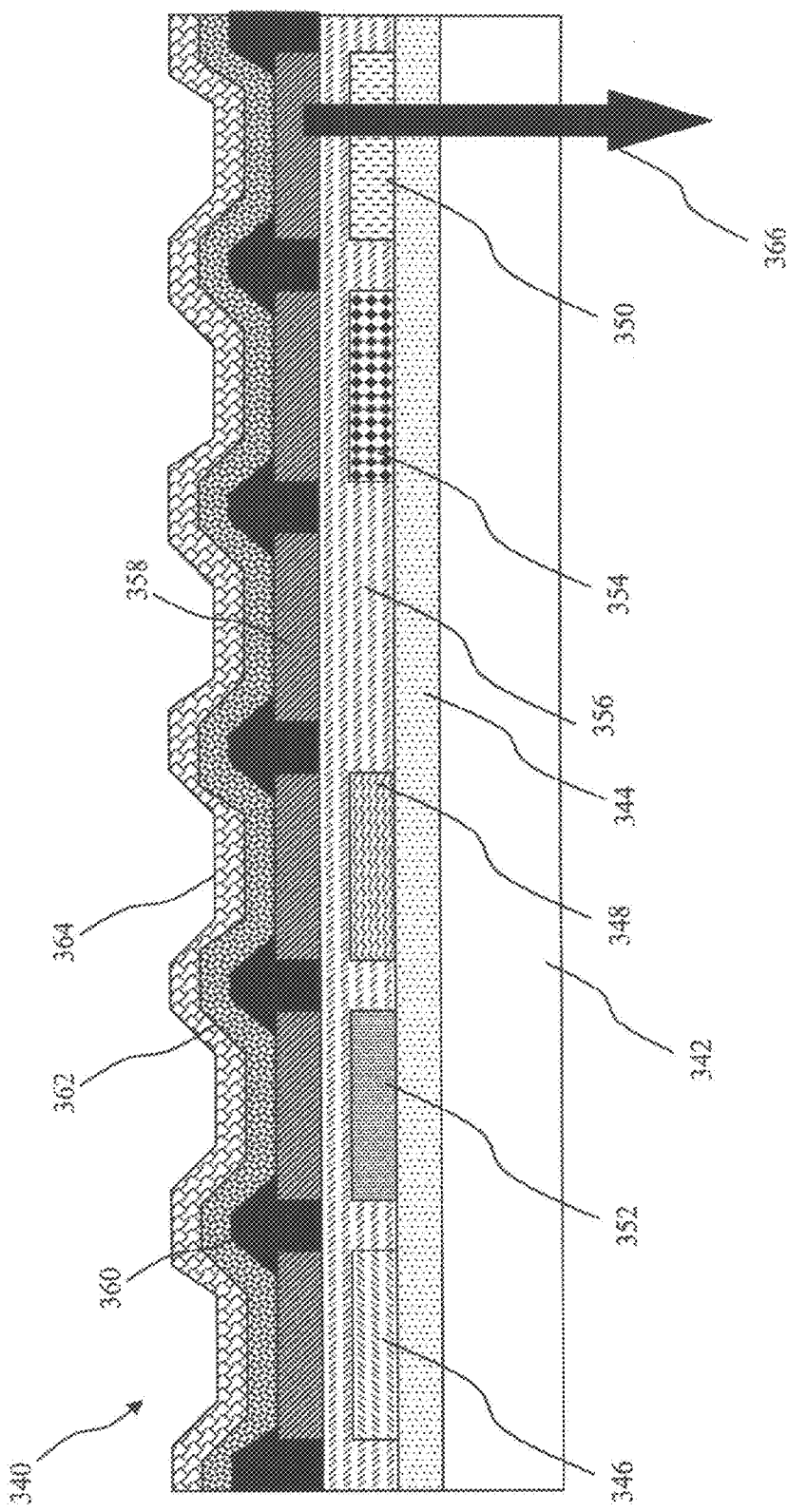
FIG. 12 is a schematic of a cross section of a portion of a display panel useful in practicing an arrangement of the present invention.

FIG. 12 shows a cross-section of the display panel within the display of FIG. 11. This display panel 340 includes a substrate 342. A drive layer 344 is formed on this substrate. Color filters 346, 348, 350, 352, 354 are formed over the substrate and a smoothing layer 356 is applied. As shown in FIG. 12, six EL emitters are formed on the display panel 340 by applying five color filters having different spectra corresponding to the red, green, blue and two of the cyan, magenta and yellow EL emitters. Three of these color filters, 346, 348, and 350 are narrowband color filters for forming the gamut-defining primaries of a display of the present invention. Two of these color filters 348 and 350 are broadband color filters for filtering broadband light in an efficient manner. Although a sixth filter providing a broadband filter can be applied to form a third in-gamut EL emitter, this filter is not necessary. Therefore, the display will include corresponding color filters for each of the three gamut-defining EL emitters and exactly two of the three additional EL emitters. Above the smoothing layer 344, the first electrodes 358 are formed with insulators 360. An EL light-emitting layer 362 is formed over the first electrodes 358 and a second electrode 364 is formed over the EL light-emitting layer 344. In this device, the light emitted within each EL emitter passes in a direction 366, as indicated by the arrow. In desirable arrangements, the EL emitter without a filter will typically emit light that has a yellow or cyan bias. When the EL emitter without a filter emits light that has a yellow bias, the broadband filters 348, 350 will be cyan and magenta filters. When the EL emitter without a filter emits light that has a cyan bias, the broadband filters 348, 350 will be yellow and magenta filters.

Figure 13:
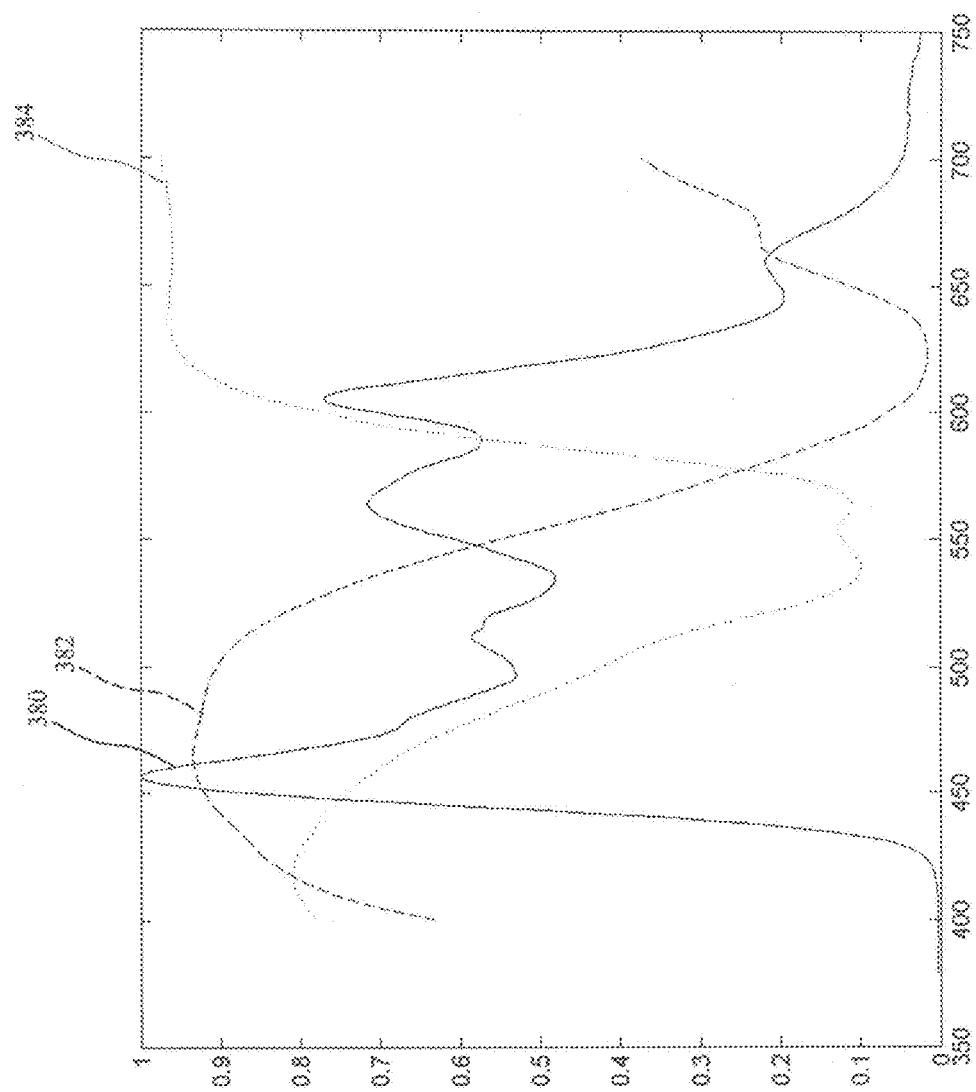
FIG. 13 is a plot of emitter spectral emission and color filter transmission spectra for emitters and color filters useful in practicing an arrangement of the present invention.

FIG. 13 shows the emission spectrum 380 of a broadband emitter as a function of wavelength. This particular emitter has a yellow bias, having chromaticity coordinates of 0.326, 0.346, having a correlated color temperature of about 5800 Kelvin. Also shown in FIG. 13 are color filter spectra 382, 384 for cyan and magenta color filters, respectively, which are useful in practicing one arrangement of the present invention. It should be acknowledged, however, that if the emitter had a cyan bias, it would be necessary to include magenta and yellow color filters.

Figure 14:
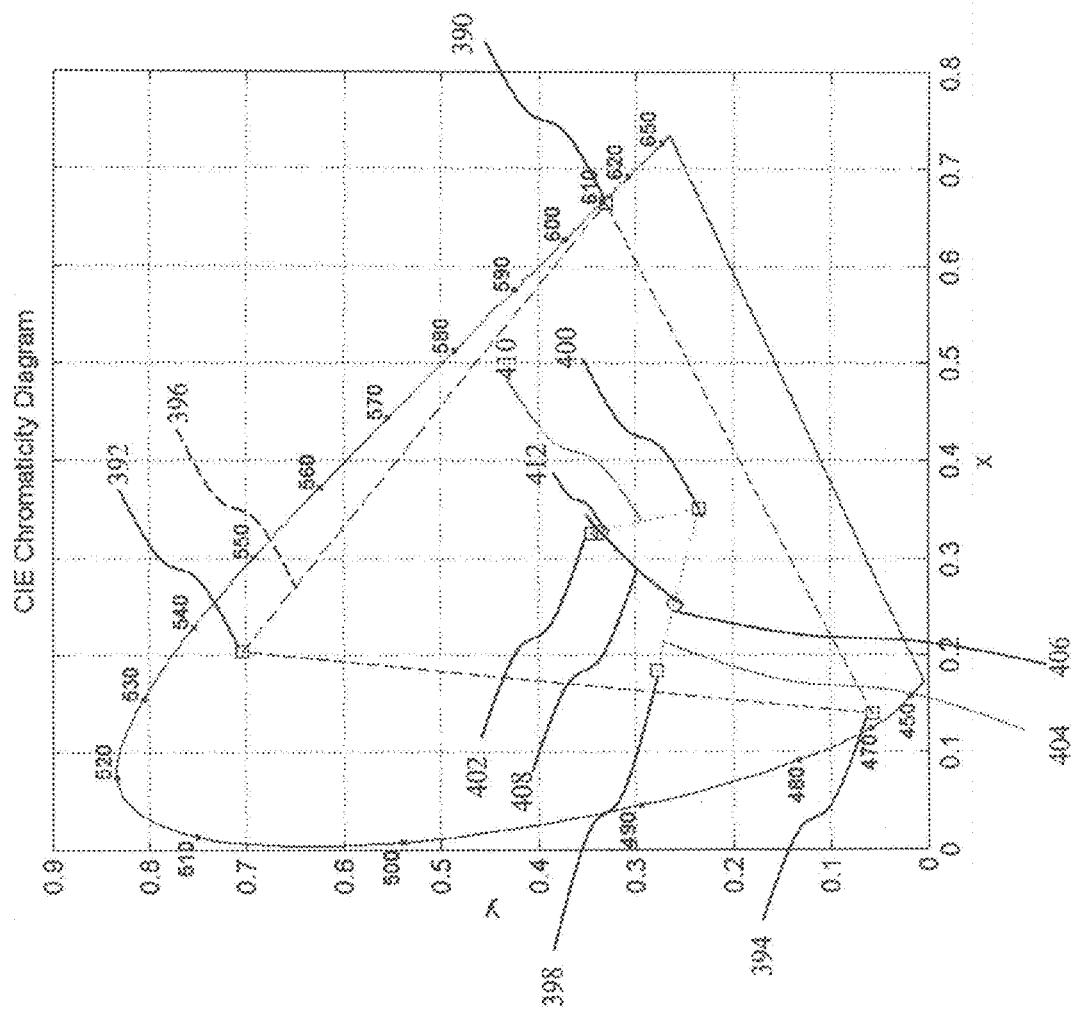
FIG. 14 is a 1931 CIE chromaticity diagram providing the location of color coordinates for EL emitters according to an arrangement of the present invention.

FIG. 14 provides a 1931 CIE chromaticity diagram including points that are achieved by applying the broadband emitter having the emission spectrum 380, together with narrowband red, green, and blue color filters and the broadband filters having spectra 382 and 384 from FIG. 13. As shown in FIG. 14 a display panel, such as 340 in FIG. 12, is formed employing these filters which include EL emitters for emitting red, green, and blue light having the chromaticity coordinates 390, 392, and 394. The chromaticity coordinates 390, 392, and 394 for the EL emitters form a gamut 396. Inside this gamut are the chromaticity coordinates 398, 400, 402 corresponding to cyan, magenta, and yellow EL emitters, respectively. A line 404 is drawn between the chromaticity coordinates 398 of the cyan EL emitter and the chromaticity coordinates 400 of the magenta EL emitter, which intersects the Planckian Locus 408 to define a first pseudo-blackbody point 406. This first pseudo-blackbody point 404 lies on the Planckian Locus and has a color temperature of about 19,500 Kelvin. A line 410 drawn between the chromaticity coordinates of the yellow EL emitter 402 and the magenta EL emitter 400 intersects the Planckian Locus 408 to define a second pseudo-blackbody point 412, having a color temperature of about 5800 Kelvin. The distance between the first and second pseudo-blackbody points along the Planckian Locus is greater than 2000 Kelvin, in fact, in this example, this difference is nearly 14,000 Kelvin.

As in the earlier arrangements, the EL display of the present invention that employs the display panel 340 would further include a structure for providing a display white point; and a controller responsive to the provided display white point and the input image signal. This controller would provides first separate drive signals for the three gamut-defining EL emitters and second separate drive signals for the three additional EL emitters, wherein the respective luminance values corresponding to the second separate drive signals are each a function of the input image signal and the distances between the chromaticity coordinates of the display white point and the first and second pseudo-blackbody points. The controller 180 shown in FIG. 10 can also be employed within this arrangement. However, the form first and second drive signal unit 214 would transform the intensities for the first and second pseudo-blackbody points to cyan, magenta, and yellow intensity values by multiplying each of these intensity values by two separate weighting values for the cyan, magenta, and yellow intensity values and summing these for each channel. These weighting values simply represent the ratio of each of the EL emitters required to create each of the pseudo-blackbody points. This controller can also employ other algorithms for converting red, green, and blue input intensity values to separate signals for driving red, green, and blue gamut defining EL emitters as well as cyan, magenta, and yellow EL emitters as are known in the art.

To demonstrate the benefit of this display device, power consumption was determined for an EL display having a red, green, blue, and the same yellowish white EL emitter as provided within this previous example. Power consumption was also determined for an EL display as described within this example. These power determinations were performed using the same typical image set, however it was determined at two different color temperatures, including 6500 Kelvin and 10,000 Kelvin. The resulting values are shown in Table 2. As shown in this Table 2, a display having only the red, green, blue and yellowish white EL emitter has draws about 4.8 W for a color temperature of 6500K. However, when this same display was used to provide images with a color temperature of 10,000K, the power consumption of the display increased significantly to more than 5.5 W. However, when using the display of the present invention having red, green, and blue gamut-defining EL emitters together with cyan, magenta, and the yellowish-white emitter as described in the example, the power was nearly equivalent regardless of color temperature increasing only from 4.3 to 4.4 W for this display configuration. It is also noteworthy that inclusion of the additional cyan and magenta emitters decreased power ay at least 10% regardless of color temperature, their addition is primarily useful when the color temperature of the display is adjusted as it reduces the sensitivity of the power consumption of the display to changes in display white point, effectively reducing the power consumption by 20% in this example when the display is driven to a white point of 10,000 Kelvin.

TABLE 2

|        | 6500 K | 10,000 K |
|--------|--------|----------|
| RGBY   | 4.8 W  | 5.5 W    |
| RGBCMY | 4.3 W  | 4.4 W    |

Although the example arrangement shown in FIG. 11 provides a broadband emitter together with three narrowband and two broadband filters, other arrangements of EL displays are formed which fulfill the requirements of the present invention. This includes displays including various optical cavity configurations and patterning of materials having different color emission.

In a preferred arrangement, the EL display of the present invention includes Organic Light Emitting Diodes (OLEDs), which are composed of small molecule or polymeric OLEDs as disclosed in but not limited to U.S. Pat. No. 4,769,292, by Tang et al., and U.S. Pat. No. 5,061,569, by VanSlyke et al. Many combinations and variations of organic light emitting materials can be used to fabricate such a panel.

The invention has been described in detail with particular reference to certain preferred embodiments thereof, but it will be understood that variations and modifications can be effected within the spirit and scope of the invention.

PARTS LIST

| 2  | EL display |
| 4  | display panel |
| 6  | red gamut-defining EL emitter |
| 8  | green gamut-defining EL emitter |
| 10 | blue gamut-defining EL emitter |
| 12 | first additional EL emitter |
| 14 | second additional EL emitter |
| 16 | white point signal |
| 18 | three-color input image signal |
| 20 | controller |
| 22 | drive signal for the gamut-defining EL emitters |
| 24 | drive signals for the additional EL emitters |
| 40 | menu |
| 42 | display white point option |
| 44 | display white point option |
| 46 | display white point option |

-continued

PARTS LIST

| 48  | separate control |
| 50  | EL display panel |
| 52  | substrate |
| 54  | drive layer |
| 56  | narrowband color filter for forming red light |
| 58  | narrowband color filter for forming green light |
| 60  | narrowband color filter for forming blue light |
| 62  | additional broadband color filter |
| 64  | smoothing layer |
| 66  | first electrode |
| 68  | insulator |
| 70  | EL emissive layer |
| 72  | second electrode |
| 74  | direction of light emission |
| 80  | EL spectrum |
| 82  | color filter spectrum |
| 84  | filtered EL spectrum |
| 90  | red EL emitter chromaticity coordinates |
| 92  | green EL emitter chromaticity coordinates |
| 94  | blue EL emitter chromaticity coordinates |
| 96  | color gamut |
| 98  | Planckian Locus |
| 100 | additional EL emitter chromaticity coordinates |
| 102 | additional EL emitter chromaticity coordinates |
| 110 | emitter spectrum |
| 112 | filter spectrum |
| 114 | filtered emitter spectrum |
| 120 | red chromaticity coordinates |
| 122 | green chromaticity coordinates |
| 124 | blue chromaticity coordinates |
| 126 | color gamut |
| 128 | Planckian Locus |
| 130 | additional emitter chromaticity coordinates |
| 132 | additional emitter chromaticity coordinates |
| 140 | EL display panel |
| 142 | substrate |
| 144 | drive layer |
| 146 | first electrode |
| 148 | insulator |
| 150 | EL emissive layer |
| 152 | second electrode |
| 154 | narrowband color filter |
| 156 | narrowband color filter |
| 158 | narrowband color filter |
| 160 | smoothing layer |
| 162 | second substrate |
| 164 | direction of light emission |
| 166 | variable thickness, non-emitting layer |
| 168 | region of first additional EL emitter |
| 170 | region of second additional EL emitter |
| 172 | aregion of EL emitter for emitting red or green light |
| 172 | bregion of EL emitter for emitting red or green light |
| 174 | region of EL emitter for emitting blue light |
| 176 | low optical index layer |
| 180 | controller |
| 182 | input image signal |
| 184 | receive input image signal unit |
| 186 | display white point signal |
| 188 | receive white point unit |
| 190 | select adaptation matrix unit |
| 192 | apply adaptation matrix unit |
| 194 | determine first normalization matrix unit |
| 196 | apply first normalization matrix unit |
| 198 | determine min unit |
| 200 | subtract min unit |
| 202 | add min unit |
| 204 | determine second normalization matrix unit |
| 206 | apply second normalization matrix unit |
| 208 | second determine min unit |
| 210 | subtract min unit |
| 212 | add min unit |
| 214 | form first and second drive signal unit |
| 216 | first drive signal |
| 218 | second drive signal |
| 220 | determine max unit |
| 222 | determine ratio unit |
| 224 | determine min ratio unit |
| 226 | scale values unit |

-continued

PARTS LIST

| | |
|---|---|
| 302 | EL display |
| 304 | substrate |
| 306 | red gamut-defining EL emitter |
| 308 | green gamut-defining EL emitter |
| 310 | blue gamut-defining EL emitter |
| 312 | additional EL emitter |
| 314 | additional EL emitter |
| 316 | additional EL emitter |
| 318 | controller |
| 320 | input image signal |
| 322 | white point signal |
| 324 | first separate drive signals |
| 326 | second separate drive signals |
| 340 | display panel |
| 342 | substrate |
| 344 | drive layer |
| 346 | narrowband color filter |
| 348 | narrowband color filter |
| 350 | narrowband color filter |
| 352 | broadband color filter |
| 354 | broadband color filter |
| 356 | smoothing layer |
| 358 | first electrode |
| 360 | insulators |
| 362 | EL light-emitting layer |
| 364 | second electrode |
| 366 | light-emission direction |
| 380 | emission spectrum |
| 382 | color filter spectrum |
| 384 | color filter spectrum |
| 390 | red chromaticity coordinates |
| 392 | green chromaticity coordinates |
| 394 | blue chromaticity coordinates |
| 396 | gamut |
| 398 | cyan chromaticity coordinates |
| 400 | magenta chromaticity coordinates |
| 402 | yellow chromaticity coordinates |
| 404 | line |
| 406 | first pseudo-blackbody point |
| 408 | Planckian Locus |
| 410 | line |
| 412 | second pseudo-blackbody point |
| 500 | point near minimum power for D65 |
| 502 | point near minimum power for 10,000 Kelvin |
| 504 | point near a distance of 0.05 from the display white point of D65 |
| 506 | point near a distance of 0.05 from the display white point of 10,000 Kelvin |

The invention claimed is:

1. An EL display adapted to receive a three-color input image signal, comprising:
   a) three gamut-defining EL emitters for emitting red, green, and blue colored light and a first and a second additional EL emitter for emitting two different additional colors of light having chromaticity coordinates specifying respective pseudo-blackbody points, the chromaticity coordinates of the two additional colors of light lying inside a gamut defined by the three gamut-defining emitters and near the Plankian Locus, wherein the two pseudo-blackbody points have respective correlated color temperatures that differ by at least 2000K, and wherein each EL emitter outputs light at a corresponding luminance value in response to a corresponding drive signal;
   b) means for providing a display white point; and
   c) a controller responsive to the provided display white point and the three-color input image signal for providing first separate drive signals for the three gamut-defining EL emitters and second separate drive signals for the two additional EL emitters, wherein the respective luminance values corresponding to the second separate drive signals are each a function of the input image signal and the distances between the display white point and the pseudo-blackbody points of the two additional colors.

2. The EL device of claim 1, wherein when the input image signal corresponds to the provided display white point, the additional emitter having a pseudo-blackbody point closest to the chromaticity coordinates of the provided display white point has a higher luminance value than the additional emitter having the pseudo-blackbody point furthest from the chromaticity coordinates of the provided display white point.

3. The EL device of claim 1, wherein one of the pseudo-blackbody points of the two additional EL emitters has a correlated color temperature of 6500K or less and the second has a correlated color temperature of 8000K or greater.

4. The EL device of claim 1, wherein each EL emitter has a respective radiant efficiency and the radiant efficiencies of the two additional emitters are both higher than all of the respective radiant efficiencies of the gamut-defining EL emitters.

5. The EL device of claim 1, further including corresponding color filters for each of the three gamut defining emitters and one of the two additional emitters.

6. The EL device of claim 1, further including a non-emitting layer having a variable thickness, wherein the non-emitting layer has a different thickness in the first additional EL emitter than the second additional EL emitter.

7. The EL device of claim 6, wherein the non-emitting layer is a transparent inorganic conductor or an organic semiconductor.

8. The EL device of claim 6, wherein the non-emitting layer has a different thickness in a first selected gamut-defining EL emitter than in a second selected gamut-defining EL emitter.

9. The EL device of claim 8, wherein the first additional EL emitter has a higher correlated color temperature than the second additional EL emitter, and wherein the thickness of the non-emitting layer within the gamut-defining EL emitter for emitting blue colored light is equal to the thickness of the non-emitting layer within the selected first additional EL emitter.

10. The EL device of claim 8, wherein the first additional EL emitter has a higher correlated color temperature than the second additional EL emitter, and wherein the thickness of the non-emitting layer within the gamut-defining EL emitter for emitting red or green colored light is equal to the thickness of the non-emitting layer within the second additional EL emitter.

11. The EL device of claim 1, wherein the display white point has a corresponding luminance value and the controller adjusts the luminance value of the display white point in response to the input image signal.

12. The EL device of claim 6, wherein the controller adjusts the luminance value of the display white point in response to a saturation of the input image signal.

13. An EL display, adapted to receive a three-color input image signal comprising:
   a) three gamut-defining EL emitters for emitting red, green, and blue colored light, wherein the three gamut-defining EL emitters define a gamut and wherein each EL emitter outputs light at a corresponding luminance value in response to a corresponding drive signal;
   b) cyan, magenta and yellow additional EL emitters for respectively emitting cyan, magenta and yellow light, wherein each additional EL emitter is within the gamut and has respective chromaticity coordinates, the line between the chromaticity coordinates of the cyan EL emitter and the magenta EL emitter intersects the Planckian Locus to define a first pseudo-blackbody point, the line between the chromaticity coordinates of the yellow EL emitter and the magenta EL emitter intersects the Planckian Locus to define a second pseudo-blackbody point, the distance between the first and second pseudo-blackbody points along the Planckian Locus is greater than 2000K, and wherein each EL emitter outputs light at a corresponding luminance value in response to a corresponding drive signal c) means for providing a display white point; and
d) a controller responsive to the provided display white point and the input image signal for providing first separate drive signals for the three gamut-defining EL emitters and second separate drive signals for the three additional EL emitters, wherein the respective luminance values corresponding to the second separate drive signals are each a function of the input image signal and the distances between the chromaticity coordinates of the display white point and the first and second pseudo-blackbody points.

14. The EL device of claim 13, wherein when the input image signal corresponds to the provided display white point, the sum of the luminance values of the additional emitters defining a pseudo-blackbody point closest to the chromaticity coordinates of the provided display white point is higher than the sum of the luminance values of the additional emitters defining a pseudo-blackbody point furthest from the provided display white point.

15. The EL device of claim 13, wherein the second pseudo-blackbody point has a correlated color temperature of 6500K or less and the first pseudo-blackbody point has a correlated color temperature of 8000K or greater.

16. The EL device of claim 13, wherein each EL emitter has a respective radiant efficiency and the radiant efficiencies of the three additional emitters are all higher than all of the respective radiant efficiencies of the gamut-defining EL emitters.

17. The EL device of claim 13, further including corresponding color filters for each of the three gamut-defining EL emitters and exactly two of the three additional EL emitters.

18. The EL device of claim 13, wherein the display white point has a corresponding luminance value and the controller adjusts the luminance value of the display white point in response to the input image signal.

19. The EL device of claim 18, wherein the controller adjusts the luminance value of the display white point in response to a saturation of the input image signal.

* * * * *